(12) United States Patent
Hovis et al.

(10) Patent No.: US 7,368,787 B2
(45) Date of Patent: May 6, 2008

(54) FIN FIELD EFFECT TRANSISTORS (FINFETS) AND METHODS FOR MAKING THE SAME

(75) Inventors: William P. Hovis, Rochester, MN (US); Jack A. Mandelman, Flat Rock, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/132,652

(22) Filed: May 19, 2005

(65) Prior Publication Data

US 2006/0261414 A1 Nov. 23, 2006

(51) Int. Cl.
*H01L 29/72* (2006.01)

(52) U.S. Cl. .................. 257/347; 257/192; 257/401; 257/202

(58) Field of Classification Search ............. 257/347, 257/192, 202, 401
See application file for complete search history.

(56) References Cited

U.S. PATENT DOCUMENTS

| | | |
|---|---|---|
| 6,492,212 B1 | 12/2002 | Ieong et al. |
| 6,800,885 B1 | 10/2004 | An et al. |
| 7,091,566 B2* | 8/2006 | Zhu et al. .............. 257/401 |
| 2003/0201458 A1* | 10/2003 | Clark et al. ............. 257/192 |
| 2004/0100306 A1 | 5/2004 | Krivokapic et al. |
| 2004/0169239 A1 | 9/2004 | Rim |
| 2005/0040444 A1 | 2/2005 | Cohen |

FOREIGN PATENT DOCUMENTS

WO   WO 2005/038930 A   4/2005

OTHER PUBLICATIONS

"Turning Silicon On Its Edge", IEEE Circuits & Devices Magazine, Jan./Feb. 2004, Edward J. Nowak, Ingo Aller, Thomas Ludwig, Keunwoo Kim, Rajiv V. Joshi, Ching-Te Chuang, Kerry Bernstein, and Ruchir Puri, pp. 20-31.
"Improved Independent Gate N-Type FinFET Fabrication and Characterization", IEEE Electron Device Letters, vol. 24, No. 9, Sep. 2003, David M. Fried, Jon S. Duster and Kevin T. Kornegay, pp. 592-594.
"A Fin-Type Independent-Double-Gate NFET", David M. Fried, Edward J. Nowak, Jakub Kedzierski, Jon S. Duster, Kevin T. Kornegay, AIMS Research Group, 330 Phillips Hall, Cornell University, Ithaca, New York, 14853, pp. 45-46.
"High-Performance P-Type Independent-Gate FinFETs", IEEE Electron Device Letters, vol. 25, No. 4. Apr. 2004, David M. Fried, Jon S. Duster and Kevin T. Kornegay, pp. 199-201.
"High-performance symmetric-gate and CMOS-compatible Vt asymmetric-gate FinFET devices", IEEE 2001, Jakub Kedzierski, et al, IEDM 01-437-440.

* cited by examiner

*Primary Examiner*—Edward Wojciechowicz
(74) *Attorney, Agent, or Firm*—Dugan & Dugan

(57) ABSTRACT

In a first aspect, a first method is provided for semiconductor device manufacturing. The first method includes the steps of (1) forming a first side of a fin of a fin field effect transistor (FinFET); (2) processing the first side of the fin; and (3) forming a second side of the fin while supporting the first side of the fin. Numerous other aspects are provided.

5 Claims, 39 Drawing Sheets

FIN FIELD EFFECT TRANSISTORS (FINFETS) AND METHODS FOR MAKING THE SAME

FIELD OF THE INVENTION

The present invention relates generally to semiconductor devices, and more particularly to fin field effect transistors (FinFETs) and methods for making the same.

BACKGROUND

A FinFET is a transistor that includes a fin (e.g., of silicon) separating a first gate from a second gate, which is opposite the first gate, of the transistor. Yields of conventional methods of manufacturing FinFETs are reduced due to fin damage during manufacturing. Additionally, the ability to tailor the structure of FinFETs resulting from such conventional methods may be limited. For example, gate dielectrics respectively coupled to opposing sides of the fin during manufacturing are of the same width and formed of the same material. Further, a work function of a gate conductor coupled to the first gate is the same as a work function of a gate conductor coupled to the second gate. Accordingly, improved FinFETs and methods for making the same are desirable.

SUMMARY OF THE INVENTION

In a first aspect of the invention, a first method is provided for semiconductor device manufacturing. The first method includes the steps of (1) forming a first side of a fin of a fin field effect transistor (FinFET); (2) processing the first side of the fin; and (3) forming a second side of the fin while supporting the first side of the fin.

In a second aspect of the invention, a first apparatus is provided. The first apparatus is a semiconductor device that includes (1) a fin, having a first side and a second side, adapted to define a channel of the semiconductor device; (2) a first dielectric of a first material coupled to the first side of the fin; and (3) a second dielectric of a second material coupled to the second side of the fin.

In a third aspect of the invention, a second apparatus is provided. The second apparatus is a semiconductor device that includes (1) a fin, having a first side and a second side, adapted to define a channel of the semiconductor device; (2) a first gate conductor of a first material coupled to the first side of the fin; and (3) a second gate conductor of a second material coupled to the second side of the fin. The first and second gate conductors are adapted to control a current through the channel.

In a fourth aspect of the invention, a third apparatus is provided. The third apparatus is a semiconductor device that includes (1) a fin, having a first side and a second side, adapted to define a channel of the semiconductor device; (2) a first dielectric of a first width coupled to the first side of the fin; and (3) a second dielectric of a second width coupled to the second side of the fin. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides improved semiconductor devices and methods for making the same. More specifically, the present invention provides improved fin field effect transistors (FinFETS) and methods for making the same. The present methods of manufacturing FinFETs provide support (e.g., on one or more sides) to silicon which ultimately forms a fin during (e.g., throughout) manufacturing. In this manner, damage to the fin while manufacturing a FinFET may be reduced and/or eliminated, and therefore, a semiconductor device manufacturing yield may be improved.

Further, in contrast to conventional methods, the variability of a structure of a FinFET resulting from the present methods is not limited. For example, a FinFET in accordance with the present methods and apparatus may include a first gate conductor, which has a first work function, coupled to a first gate of the FinFET, and may include a second gate conductor, which has a different (e.g., a second) work function, coupled to a second gate of the FinFET. Additionally or alternatively, a FinFET in accordance with the present methods and apparatus may include a first gate dielectric of a first material coupled to a first side of a fin of the FinFET and may include a second gate dielectric of a different (e.g., second) material coupled to a second side of the fin. Additionally or alternatively, a FinFET in accordance with the present methods and apparatus may include a first gate dielectric of a first width coupled to a first side of a fin of the FinFET and a second gate dielectric of a different (e.g., second) width coupled to a second side of the fin. In this manner, the present methods and apparatus may overcome limitations of conventional semiconductor device manufacturing methods and apparatus.

Figure 1:
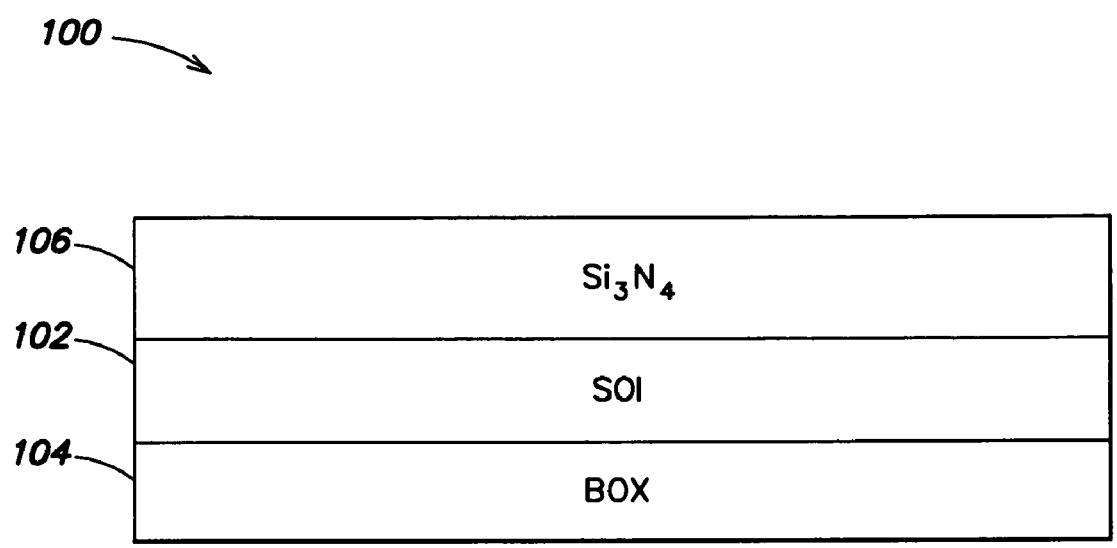
FIG. 1 illustrates a cross-sectional front view of a step of a first exemplary method of forming a FinFET in which nitride is formed on a substrate in accordance with an embodiment of the present invention.

FIGS. 1-17C illustrate a first exemplary method of forming a FinFET in accordance with an embodiment of the present invention and FIGS. 18-34C illustrate a second exemplary method of forming a FinFET in accordance with an embodiment of the present invention. In FIGS. 2A to 17A, cross-sectional front views are taken along cut lines 2B-2B to 17B-17B, respectively, and cross-sectional side views are taken along cut lines 2C-2C to 17C-17C, respectively. Similarly, in FIGS. 19A to 34A, cross-sectional front views are taken along cut lines 19B-19B to 34B-34B, respectively, and cross-sectional side views are taken along cut lines 19C-19C to 34C-34C, respectively. FIG. 1 illustrates a cross-sectional front view of a step of a first exemplary method of forming a FinFET in which nitride is formed on a substrate in accordance with an embodiment of the present invention. With reference to FIG. 1, the first exemplary method may process a silicon-on-oxide (SOI) substrate 100. The SOI substrate 100 may include a layer 102 of silicon (e.g., SOI layer) formed on oxide, thereby resulting in a buried oxide (BOX) layer 104. For example, during the first exemplary method, a layer 106 of nitride (e.g., pad nitride) such as $Si_3N_4$ or the like may be formed on the substrate 100. Chemical vapor deposition (CVD) or another suitable method may be employed to form the nitride layer 106. The thickness of the nitride layer may be about 10 nm to about 500 nm (although a larger or smaller thickness may be employed).

Alternatively, in some embodiments, a thin layer of oxide (e.g., pad oxide) (not shown) may be formed on the SOI layer 102, and a layer of pad nitride may be formed as described above on the pad oxide layer. The pad oxide layer may be about 1 nm to about 20 nm thick (although a larger or smaller thickness may be employed).

Figure 2A:
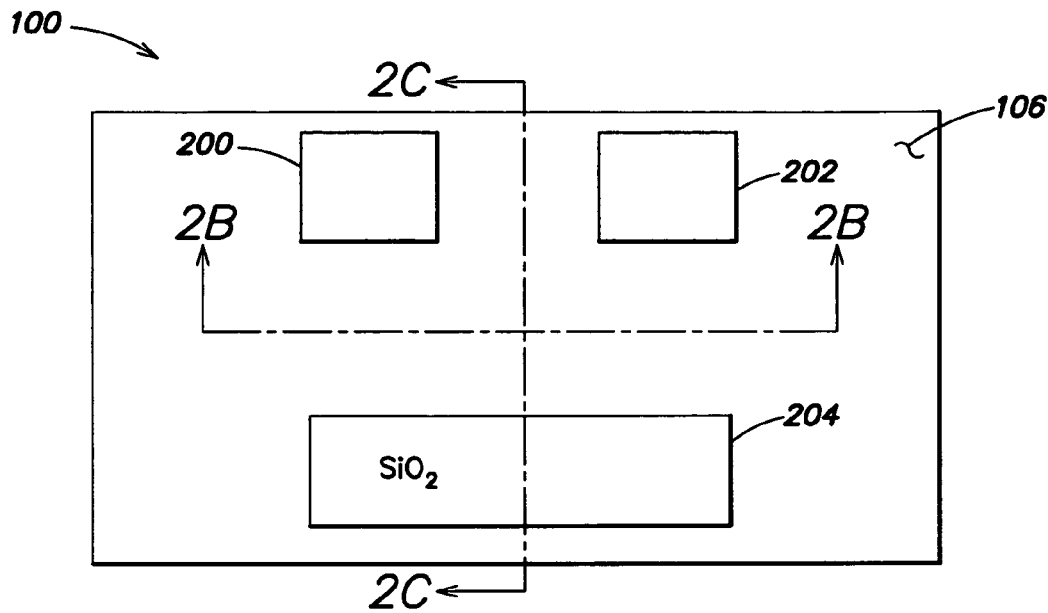
FIGS. 2A-C illustrate respective top, cross-sectional front and cross-sectional side views of a step of the first exemplary method of forming a FinFET in which oxide regions are formed in the substrate in accordance with an embodiment of the present invention.
Figure 2B:
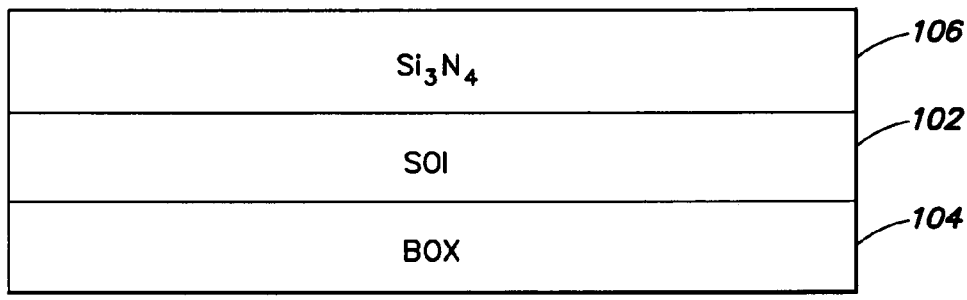
Figure 2C:
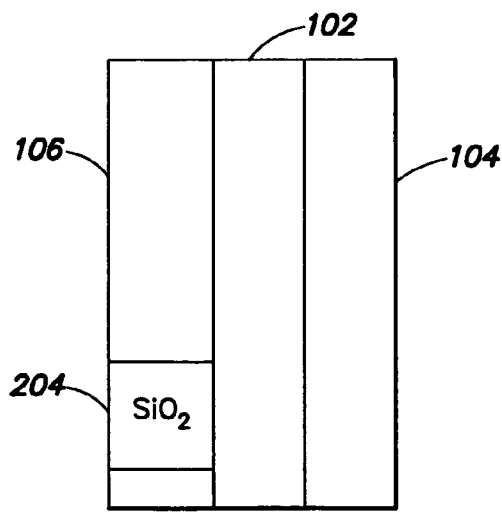

FIGS. 2A-C illustrate respective top, cross-sectional front and cross-sectional side views of a step of the first exemplary method of forming a FinFET in which oxide regions are formed in the substrate in accordance with an embodiment of the present invention. With reference to FIGS. 2A-C, the oxide regions 200-204 may be formed by patterning openings onto the nitride layer 106 using a patterning technique such as photolithography using photoresist and appropriate masking. Portions of the nitride layer 106 exposed through use of a mask employed during the patterning technique may be etched selective to silicon. Therefore, the etching of nitride in the nitride layer 106 may stop at the silicon of the SOI layer 102.

Oxide (e.g., $SiO_2$) may be deposited on the substrate 100 using CVD or another suitable deposition method such that the oxide is deposited in the regions etched in the nitride layer 106. Thereafter, CMP or another suitable technique may be employed to planarize a top surface of the substrate 100 to the nitride layer 106. In this manner, one or more oxide regions 200-204 may be formed. The one or more oxide regions 200-204 may define regions for subsequently formed pads (e.g., contact pads) to contact a source or drain diffusion region of the substrate 100. For example, a first and second oxide regions 200, 202 may define regions for subsequently formed pads to contact first and second drain diffusion regions (e.g., silicon regions beneath the first and second oxide regions 200, 202), respectively, of the substrate 100. Similarly, a third oxide region 204 may define a subsequently form pad to contact a source diffusion region (e.g., a silicon region beneath the third oxide region 204) of the substrate 100.

Figure 3A:
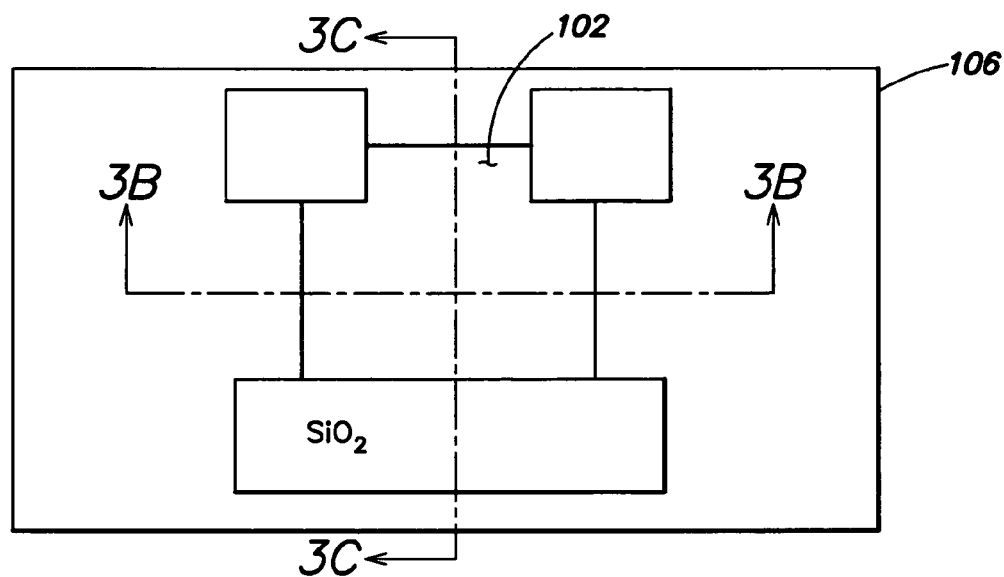
FIGS. 3A-C illustrate respective top, cross-sectional front and cross-sectional side views of a step of the first exemplary method of forming a FinFET in which nitride is etched in accordance with an embodiment of the present invention.
Figure 3B:
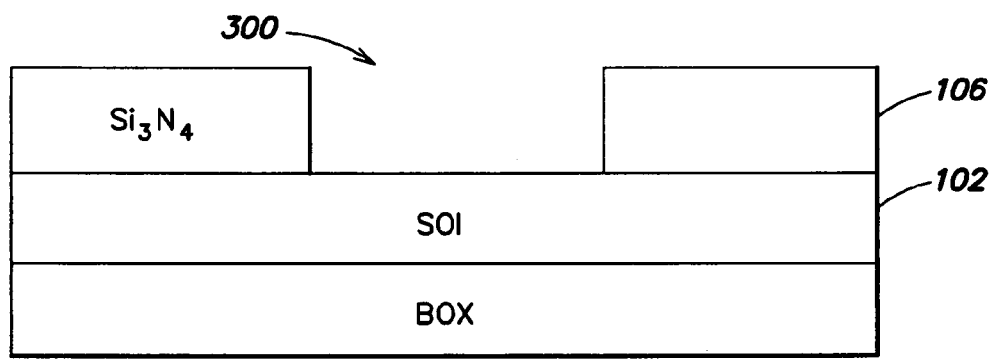
Figure 3C:
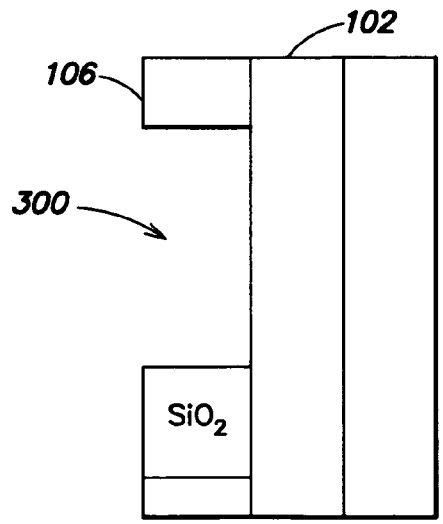

FIGS. 3A-C illustrate respective top, cross-sectional front and cross-sectional side views of a step of the first exemplary method of forming a FinFET in which nitride is etched in accordance with an embodiment of the present invention. With reference to FIGS. 3A-C, an opening may be patterned onto the nitride layer 106 using a patterning technique such as photolithography using photoresist and appropriate masking. For example, portions of the nitride layer 106 may be exposed through use of a mask employed during the patterning technique. Thereafter, reactive ion etching (RIE) or another suitable method may be employed to etch exposed portions of the nitride layer 106 selective to oxide and silicon. For example, the etching may remove nitride but may not remove oxide and silicon. Therefore, the etching may remove portions of the nitride layer 106 exposed by the opening, stopping at the SOI layer 102. In this manner, a rectangular or polygonal region 300 may be formed in the nitride layer 106. A perimeter of the rectangular or polygonal region 300 may determine, in part, a location of one or more fins that are subsequently formed during the first exemplary method.

Figure 4A:
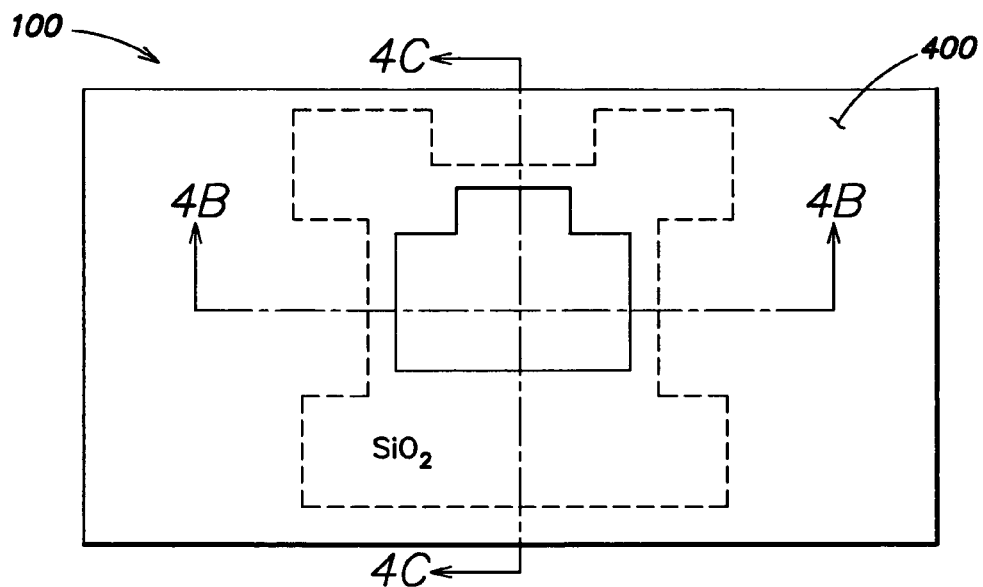
FIGS. 4A-C illustrate respective top, cross-sectional front and cross-sectional side views of a step of the first exemplary method of forming a FinFET in which an oxide is deposited on the substrate in accordance with an embodiment of the present invention.
Figure 4B:
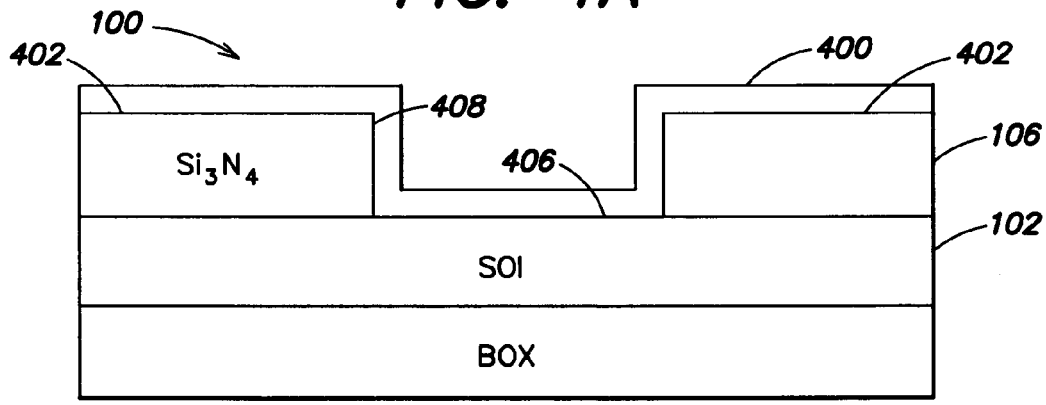
Figure 4C:
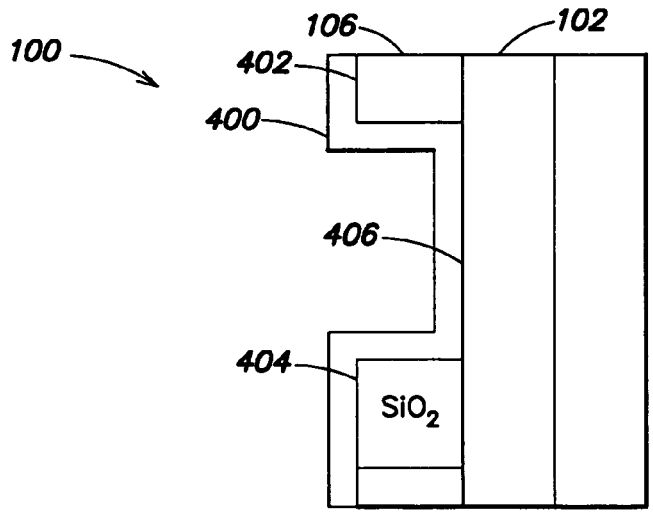

FIGS. 4A-C illustrate respective top, cross-sectional front and cross-sectional side views of a step of the first exemplary method of forming a FinFET in which an oxide is deposited on the substrate in accordance with an embodiment of the present invention. With reference to FIGS. 4A-C, CVD or another suitable deposition technique may be employed to deposit (e.g., conformally) a layer 400 of oxide over a top surface of the substrate 100. In this manner, a layer 400 of oxide may form on exposed portions of a top surface 402 of the nitride layer, exposed portions of a top surface 404 of the oxide regions (200-204 in FIG. 2A), exposed portions of a top surface 406 of the SOI layer 102, and/or exposed sidewalls 408 of the nitride layer 106 that form the rectangular or polygonal region (300 in FIGS. 3B-C). The thickness of the deposited layer 400 of oxide may determine a width of one or more fins that are subsequently formed. In one embodiment, the thickness of the deposited layer 400 of oxide may be about 2 nm to about 50 nm thick. However, a larger or smaller thickness may be employed. It should be noted from the cross-sectional front views, that the first exemplary method may form two FinFETs in the substrate 100 (e.g., a first FinFET on the left side of the front views and a second FinFET on the right side of the front views). For ease of description, when convenient, only the FinFET manufactured on the left side of the cross-sectional front views may be referenced.

Figure 5A:
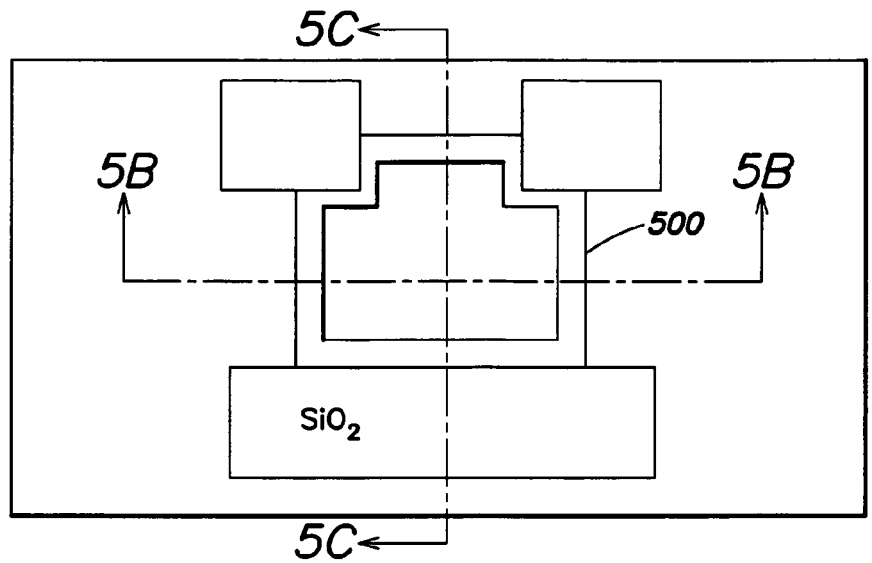
FIGS. 5A-C illustrate respective top, cross-sectional front and cross-sectional side views of a step of the first exemplary method of forming a FinFET in which oxide spacers are formed in accordance with an embodiment of the present invention.
Figure 5B:
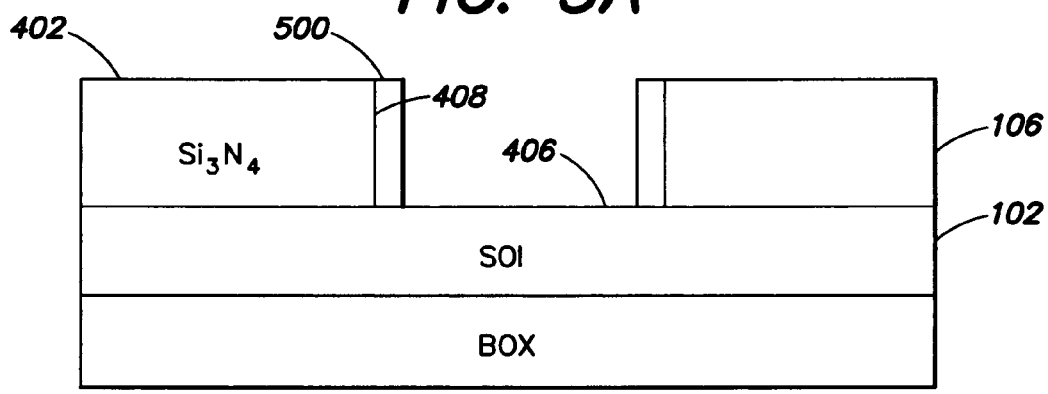
Figure 5C:
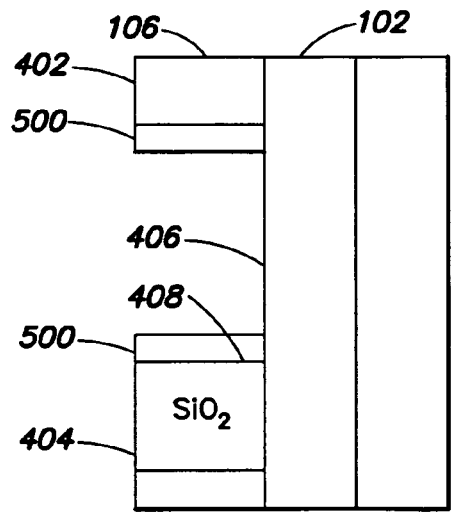

FIGS. 5A-C illustrate respective top, cross-sectional front and cross-sectional side views of a step of the first exemplary method of forming a FinFET in which oxide spacers are formed in accordance with an embodiment of the present invention. With reference to FIGS. 5A-C, RIE or another suitable etching method may be employed to etch portions of the oxide layer (400 in FIGS. 4A-C) selective to nitride. For example, portions of the oxide layer 400 deposited on the top surface 402 of the nitride layer 106, top surface 406 of the SOI layer 102 and/or top surface 404 of the oxide regions 202-204 may be removed. In this manner, narrow oxide spacers 500 may be formed on sidewalls (e.g., vertical sidewalls) 408 of the nitride layer 106. The width of the narrow oxide spacers 500 may be the same as the thickness of the deposited layer 400 of oxide.

Figure 6A:
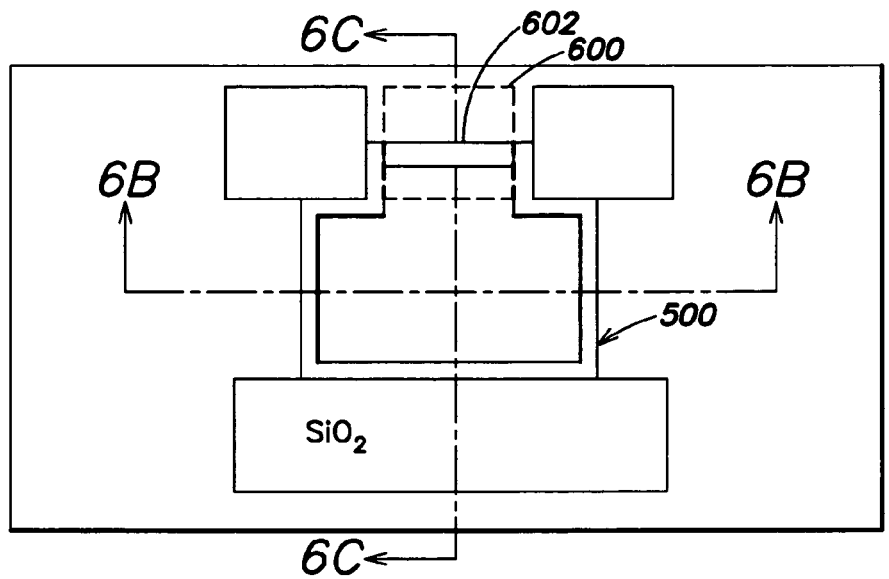
FIGS. 6A-C illustrate respective top, cross-sectional front and cross-sectional side views of a step of the first exemplary method of forming a FinFET in which a mask is formed on the substrate in accordance with an embodiment of the present invention.
Figure 6B:
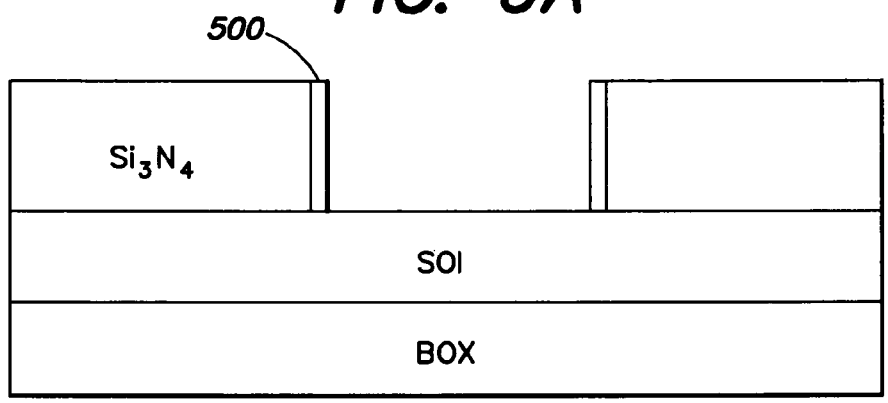
Figure 6C:
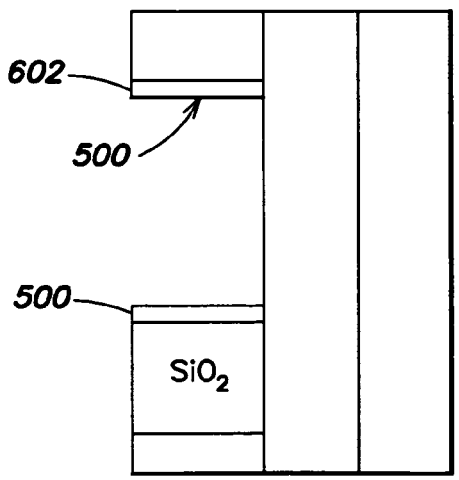

FIGS. 6A-C illustrate respective top, cross-sectional front and cross-sectional side views of a step of the first exemplary method of forming a FinFET in which a mask is formed on the substrate in accordance with an embodiment of the present invention. With reference to FIGS. 6A-C, a mask (e.g., a fin cut or trim mask) 600 may be patterned onto the substrate 100 using a patterning technique such as photolithography using photoresist and appropriate masking, such that a portion 602 of an oxide spacer 500 may be exposed.

Figure 7A:
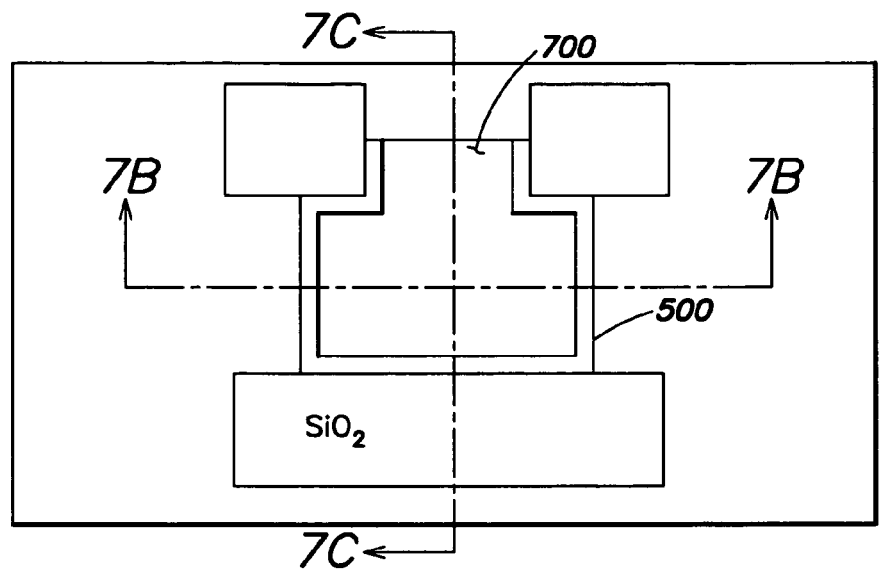
FIGS. 7A-C illustrate respective top, cross-sectional front and cross-sectional side views of a step of the first exemplary method of forming a FinFET in which oxide is etched from the substrate in accordance with an embodiment of the present invention.
Figure 7B:
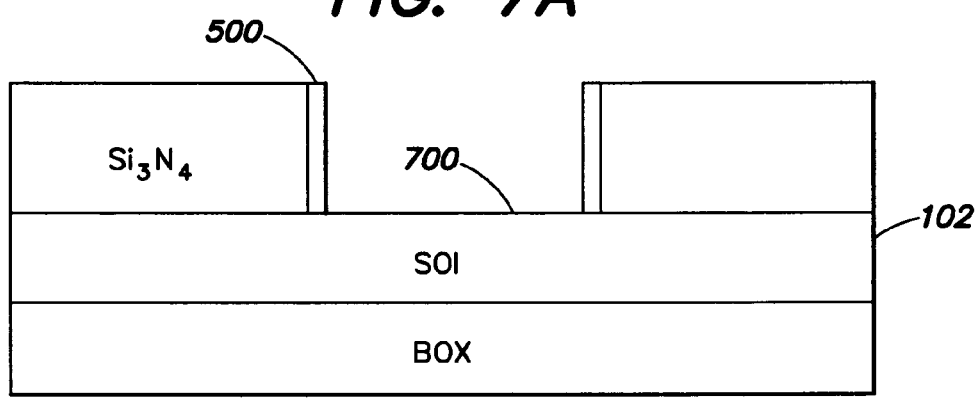
Figure 7C:
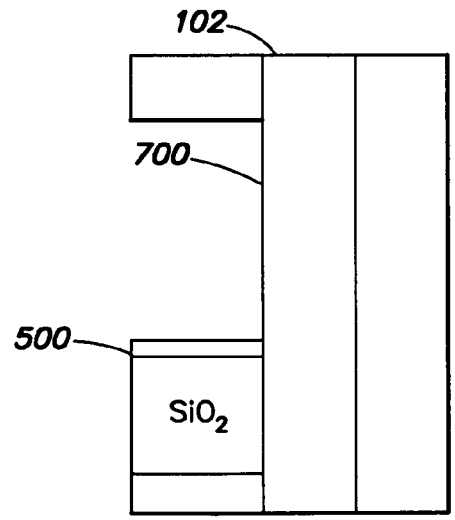

FIGS. 7A-C illustrate respective top, cross-sectional front and cross-sectional side views of a step of the first exemplary method of forming a FinFET in which oxide is etched from the substrate in accordance with an embodiment of the present invention. More specifically, with reference to FIGS. 7A-C, isotropic etching or another suitable method may be employed to remove the exposed portion (602 in FIGS. 6A and 6C) of the oxide spacer (500 in FIG. 6C). In this manner, the oxide spacer 500 may be selectively etched. Consequently, the portion of a top surface 700 of the SOI layer 102 previously covered by the removed oxide spacer 500 is now exposed.

Figure 8A:
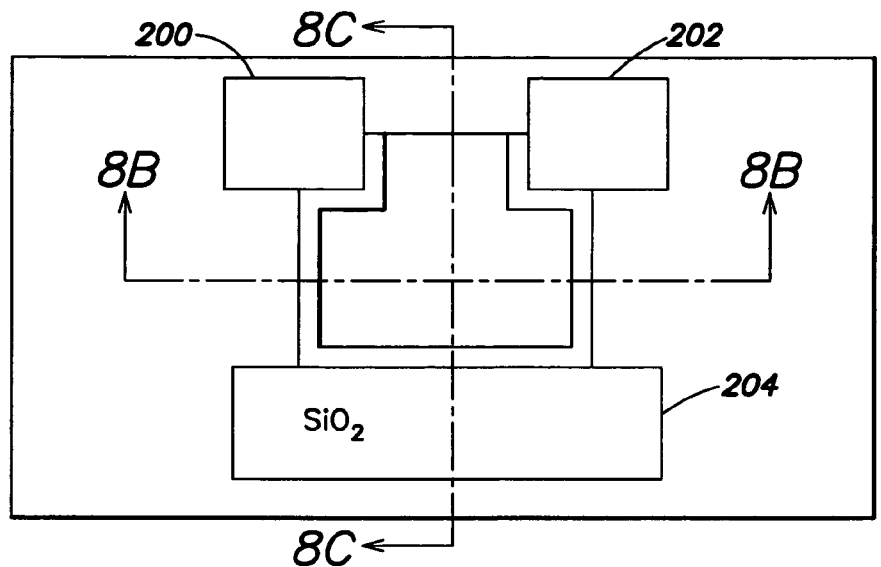
FIGS. 8A-C illustrate respective top, cross-sectional front and cross-sectional side views of a step of the first exemplary method of forming a FinFET in which silicon is etched from the substrate in accordance with an embodiment of the present invention.
Figure 8B:
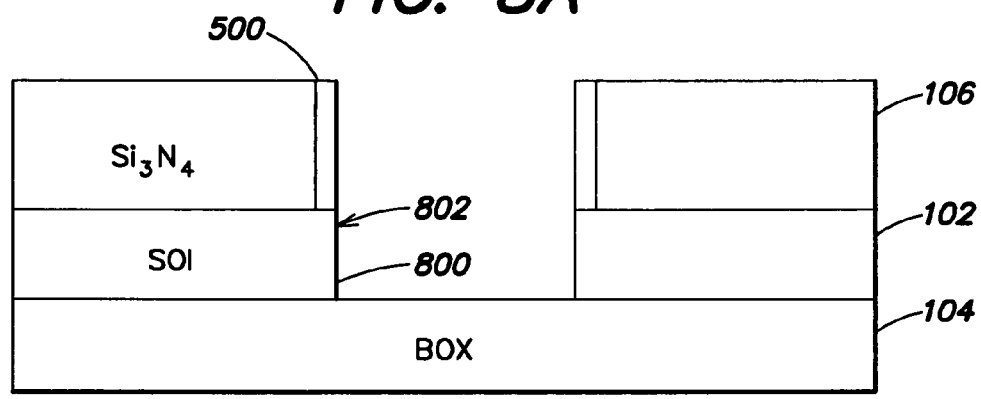
Figure 8C:
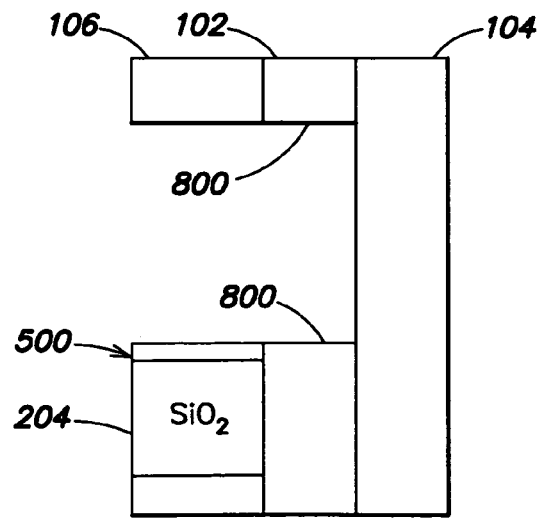

FIGS. 8A-C illustrate respective top, cross-sectional front and cross-sectional side views of a step of the first exemplary method of forming a FinFET in which silicon is etched from the substrate in accordance with an embodiment of the present invention. With reference to FIGS. 8A-C, RIE or another suitable method may be employed to etch the exposed top surface (700 in FIGS. 7A-C) of the SOI layer 102 selective to nitride and oxide. In this manner, the exposed top surface 700 of the SOI layer 102 may be removed without removing the nitride layer 106, the oxide regions 200-204, remaining portions of the oxide spacer 500 and/or the buried oxide (BOX) layer 104. Consequently, one or more sidewalls 800 of the SOI layer 102 may be exposed. An exposed sidewall 800 may serve as a first side 802 of a subsequently formed fin (1200 in FIG. 12B) of the FinFET being manufactured. Therefore, gas phase doping, angled ion implantation or another suitable method for doping a portion of silicon which may subsequently form a channel in the FinFET may be employed. Depending on the different types of semiconductor devices that are being manufactured, multiple masking steps may be employed during channel doping to provide desired doping effects to the different device types. In some embodiments, channel doping may be omitted. For example, in embodiments in which a FinFET with an extremely narrow fin for fully depleted operation are being manufactured, channel doping may not be required.

Figure 9A:
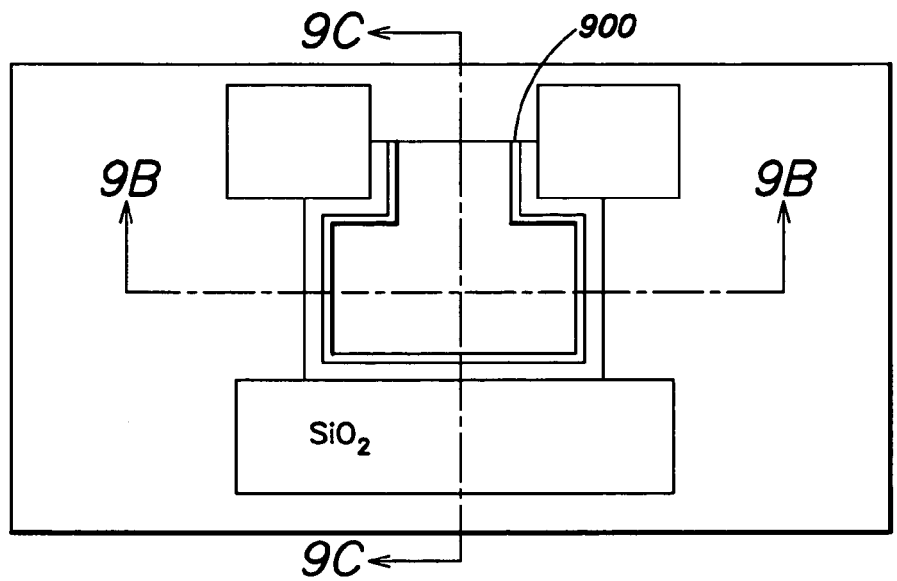
FIGS. 9A-C illustrate respective top, cross-sectional front and cross-sectional side views of a step of the first exemplary method of forming a FinFET in which a first gate dielectric is formed on the substrate in accordance with an embodiment of the present invention.
Figure 9B:
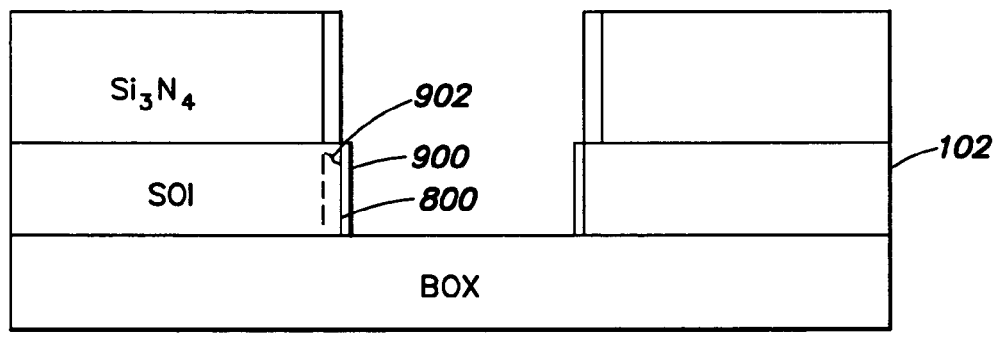
Figure 9C:
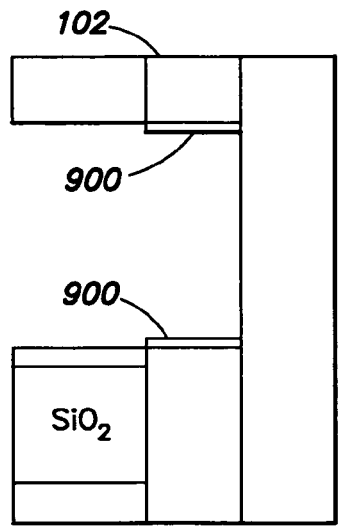

FIGS. 9A-C illustrate respective top, cross front and cross-sectional side views of a step of the first exemplary method of forming a FinFET in which a first gate dielectric is formed on the substrate in accordance with an embodiment of the present invention. With reference to FIGS. 9A-C, thermal oxidation, thermal nitridation and/or conformal deposition, or another suitable method may be employed to form a first dielectric 900 on the sidewall 800 of the SOI layer 102. A portion 902 (shown in phantom) of the SOI layer 102 on which the first gate dielectric 900 is formed may subsequently be formed into a fin (1200 in FIG. 12B). In this manner, the first gate dielectric 900 may be formed on a first side of the fin. The first gate dielectric 900 may include at least one of a silicon oxide, silicon oxynitride, silicon nitride and high-k dielectric (e.g., silicon-hafnium-oxynitride). However, the first gate dielectric 900 may include a larger or smaller number of and/or different gate insulator materials. The electrical thickness of the first gate dielectric 900 may be about 1 nm to about 6 nm (although a larger or smaller thickness may be employed). It should be noted that while the first side of the fin is formed an ultimate second side of the fin is included in the SOI layer 102 and supported thereby.

Figure 10A:
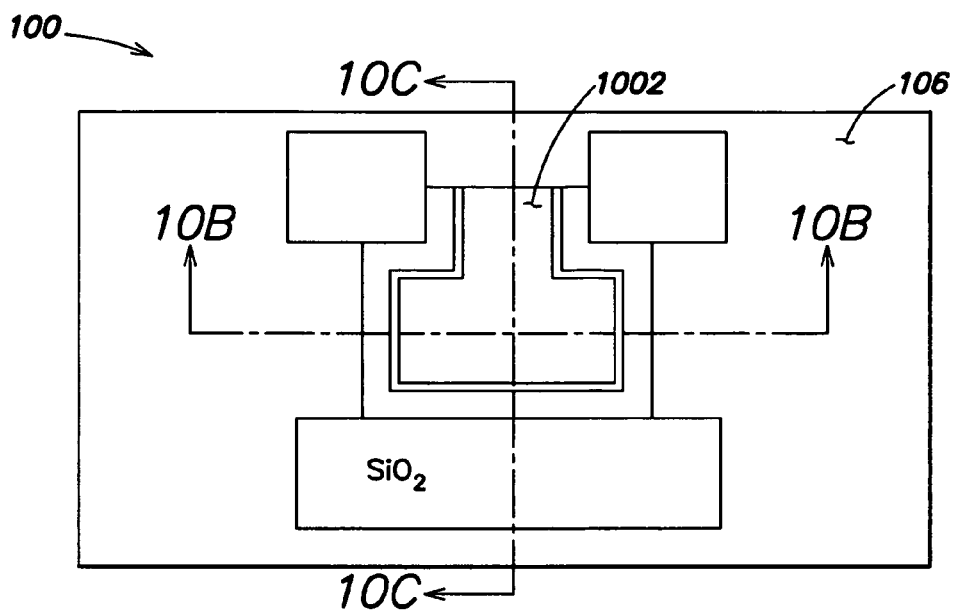
FIGS. 10A-C illustrate respective top, cross front and cross-sectional side views of a step of the first exemplary method of forming a FinFET in which a first gate conductor is formed on the substrate and an oxide layer is formed on the gate conductor in accordance with an embodiment of the present invention.
Figure 10B:
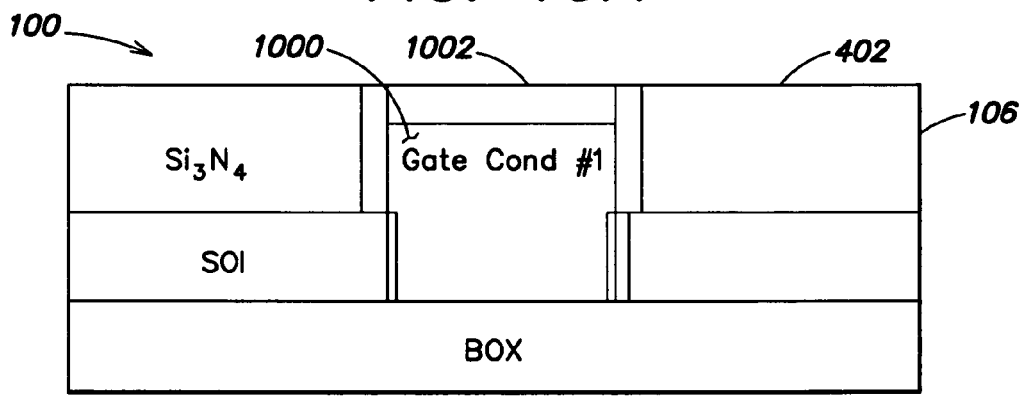
Figure 10C:
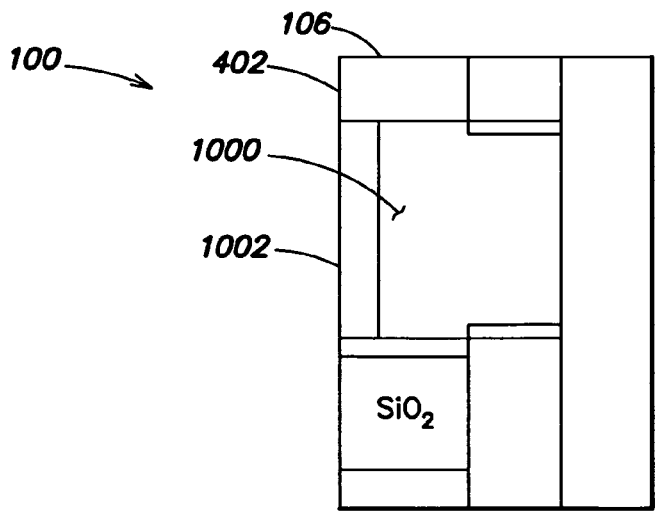

FIGS. 10A-C illustrate respective top, cross-sectional front and cross-sectional side views of a step of the first exemplary method of forming a FinFET in which a first gate conductor is formed on the substrate and an oxide layer is formed on the gate conductor in accordance with an embodiment of the present invention. With reference to FIGS. 10A-C, CVD or another suitable method may be employed to deposit a first gate conductor layer 1000 on a top surface of the substrate 100. Thereafter, CMP or another suitable method may be employed to planarize the gate conductor layer 1000 to a top surface 402 of the nitride layer 106. The first gate conductor may include at least one of polysilicon (e.g., doped or undoped), a silicide (e.g., nickel silicide or tungsten silicide) and/or a refractory material (e.g., tungsten). However, the first gate conductor may include a larger or smaller number of and/or different materials. The first gate conductor material may determine the work function of a first gate subsequently coupled thereto and a threshold voltage $V_t$ associated with the first gate.

RIE or another suitable method may be employed to recess the first gate conductor layer 1000 below a top surface 402 of the nitride layer 106. For example, the first gate conductor layer 1000 may be recessed about 5 nm to about 50 nm below the top surface 402 of the nitride layer 106 (although the first gate conductor layer 1000 may be recessed a larger or smaller distance). CVD or another suitable method may be employed to deposit a layer 1002 of oxide on a top surface of the substrate 100. CMP or another suitable method may be employed to planarize the oxide layer 1002 to a top surface 402 of the nitride layer 106. In this manner, the oxide layer 1002 may serve as a protective cap for the first gate conductor layer 1000.

Figure 11A:
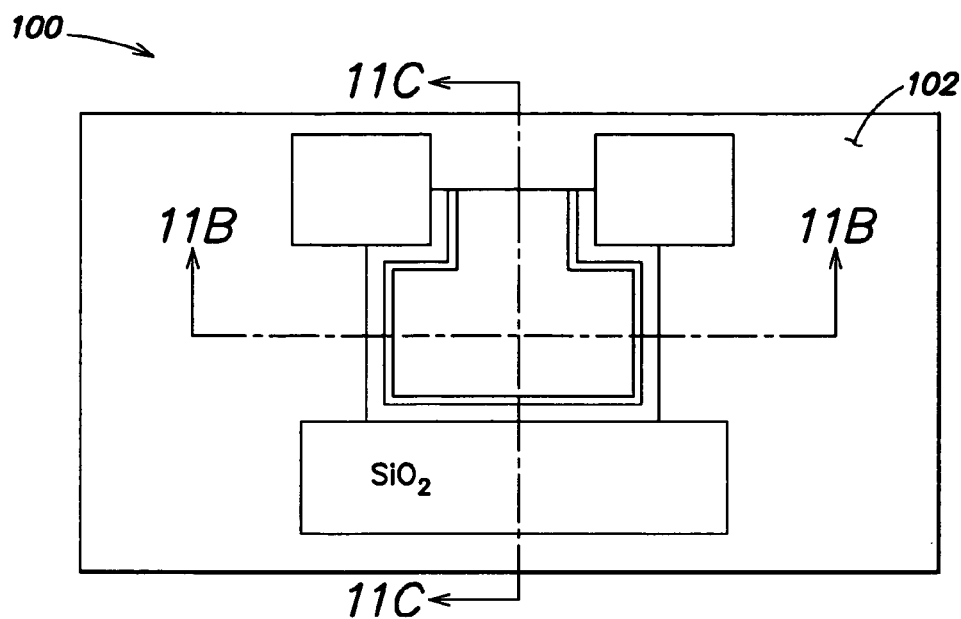
FIGS. 11A-C illustrate respective top, cross-sectional front and cross-sectional side views of a step of the first exemplary method of forming a FinFET in which nitride is etched from the substrate in accordance with an embodiment of the present invention.
Figure 11B:
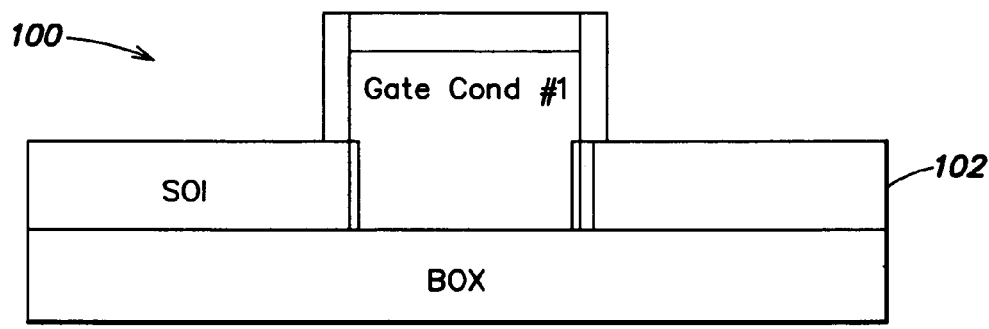
Figure 11C:
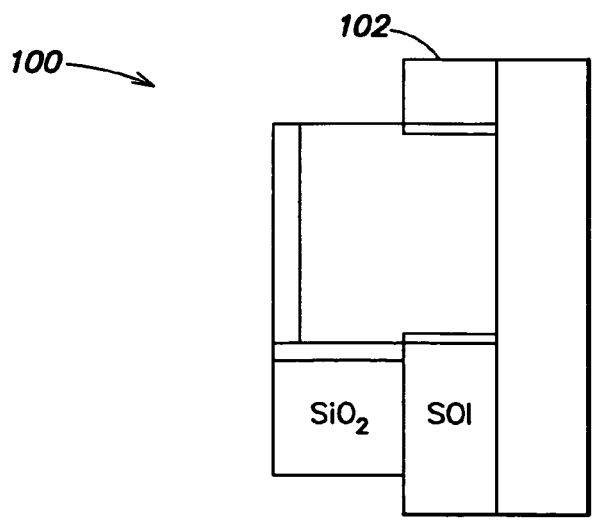

FIGS. 11A-C illustrate respective top, cross-sectional front and cross-sectional side views of a step of the first exemplary method of forming a FinFET in which nitride is etched from the substrate in accordance with an embodiment of the present invention. With reference to FIGS. 11A-C, RIE or another suitable method may be employed to etch nitride selective to oxide and silicon. In this manner, exposed portions of the nitride layer (106 in FIGS. 10A-C) may be etched (e.g., down to the SOI layer 102), and thereby removed from the substrate 100.

Figure 12A:
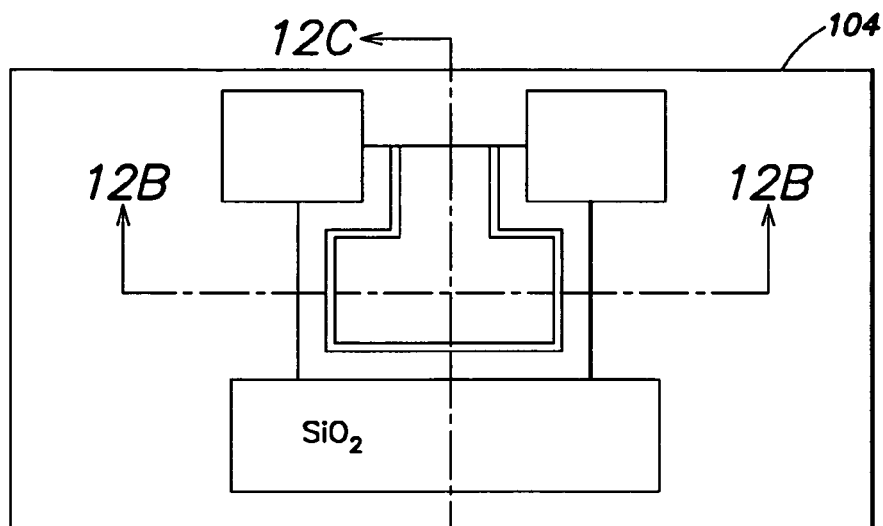
FIGS. 12A-C illustrate respective top, cross-sectional front and cross-sectional side views of a step of the first exemplary method of forming a FinFET in which silicon is etched from the substrate in accordance with an embodiment of the present invention.
Figure 12B:
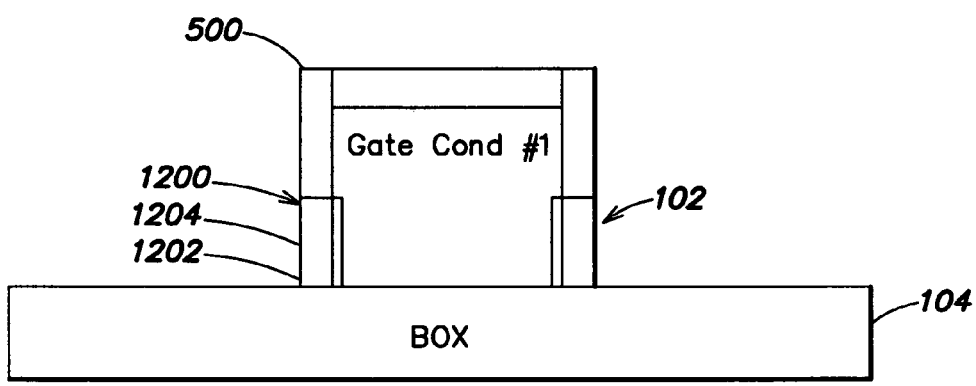
Figure 12C:
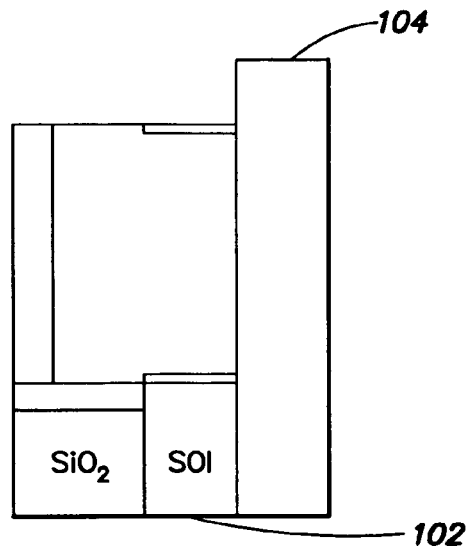

FIGS. 12A-C illustrate respective top, cross-sectional front and cross-sectional side views of a step of the first exemplary method of forming a FinFET in which silicon is etched from the substrate in accordance with an embodiment of the present invention. With reference to FIGS. 12A-C, RIE or another suitable method may be employed to etch silicon selective to oxide. In this manner, exposed portions of the SOI layer 102 may be etched (e.g., down to the BOX layer 104), and thereby removed from the substrate 100. Consequently, a fin 1200 of the FinFET being manufactured may be formed. More specifically, the silicon etching causes one or more sidewalls 1202 of the SOI layer 102 to be exposed. A sidewall 1202 of the SOI layer exposed by the silicon etching may serve as a second side 1204 of the fin 1200. In this manner, the fin 1200 of the FinFET may be formed. The width of the fin 1200 may be defined by the oxide spacer 500 overlying the fin 1200. It should be noted that while the second side 1204 of the fin 1200 is formed, the front gate conductor layer 1000 and first dielectric layer 900 support the first side 802 of the fin 1200.

Figure 13A:
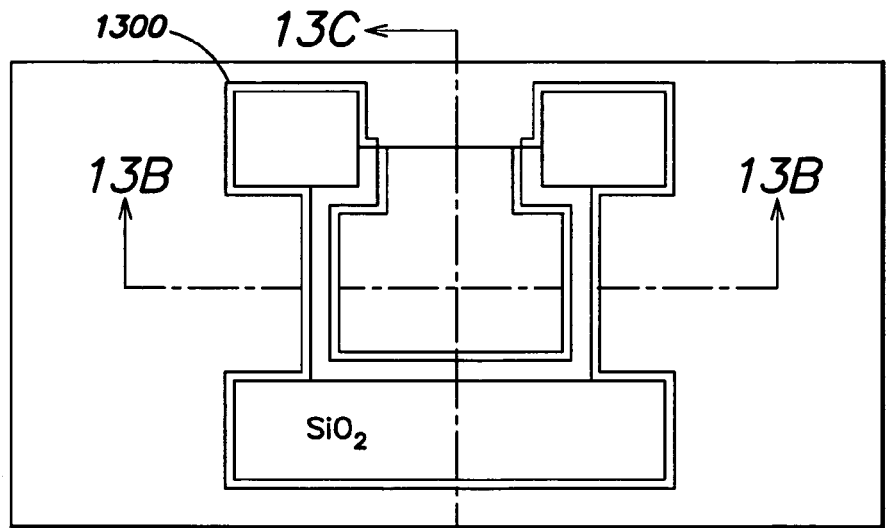
FIGS. 13A-C illustrate respective top, cross-sectional front and cross-sectional side views of a step of the first exemplary method of forming a FinFET in which a second gate dielectric is formed on the substrate in accordance with an embodiment of the present invention.
Figure 13B:
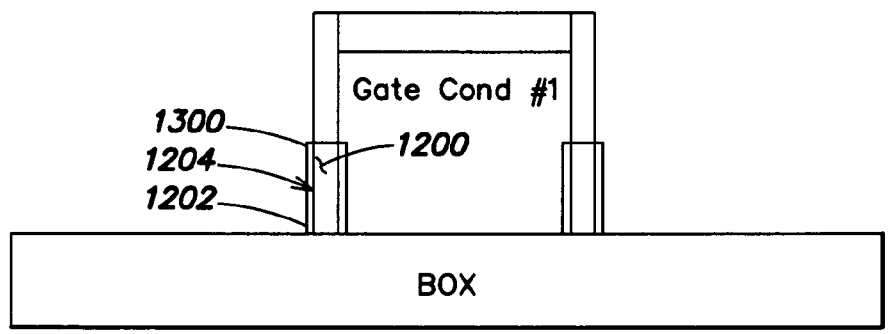
Figure 13C:
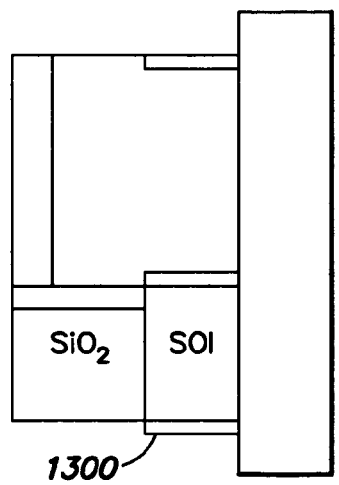

FIGS. 13A-C illustrate respective top, cross-sectional front and cross-sectional side views of a step of the first exemplary method of forming a FinFET in which a second gate dielectric is formed on the substrate in accordance with an embodiment of the present invention. With reference to FIGS. 13A-C, thermal oxidation, thermal nitridation and/or conformal deposition, or another suitable method may be employed to form a second dielectric 1300 on the sidewall 1202 of the SOI layer 102. In this manner, the second gate dielectric 1300 may be formed on the second side 1204 of the fin 1200. The second gate dielectric 1300 may include at least one of a silicon oxide, silicon oxynitride, silicon nitride and high-k dielectric (e.g., silicon-hafnium-oxynitride). However, the second gate dielectric 1300 may include a larger or smaller number of and/or different gate insulator materials. In some embodiments, the second gate dielectric material and/or width may be different than the first gate dielectric material and/or width, respectively, (although the first and second gate dielectrics may be of the same material). The electrical thickness of the second gate dielectric 1300 may be about 1 nm to about 6 nm (although a larger or smaller thickness may be employed). In some embodiments, the second gate dielectric material 1300 may be different than the first gate dielectric material 900.

Figure 14A:
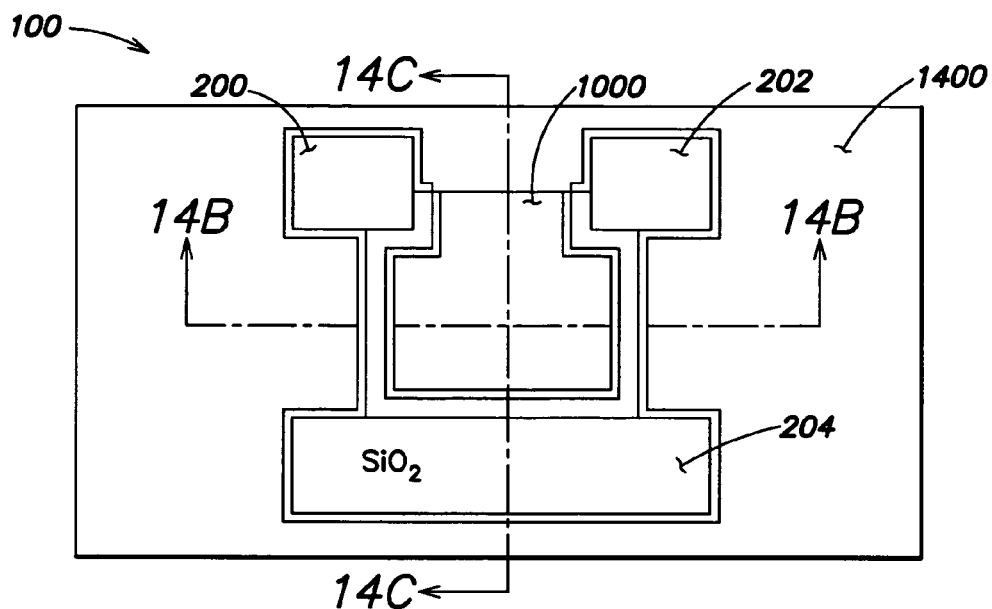
FIGS. 14A-C illustrate respective top, cross-sectional front and cross-sectional side views of a step of the first exemplary method of forming a FinFET in which a second gate conductor is formed on the substrate and planarized in accordance with an embodiment of the present invention.
Figure 14B:
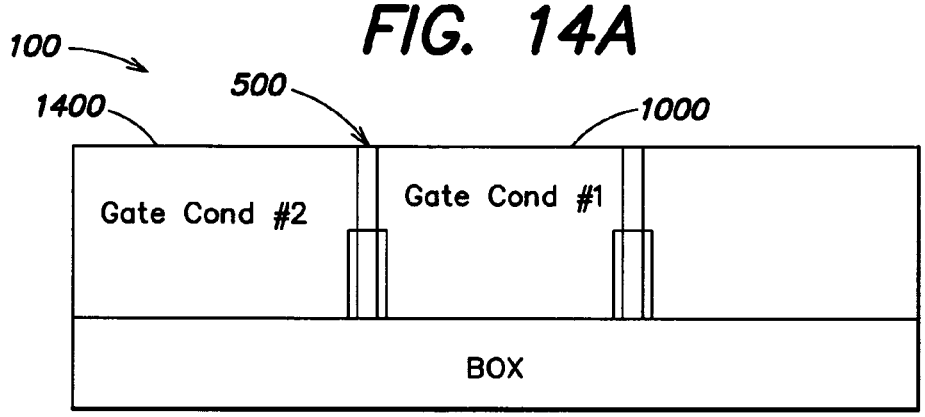
Figure 14C:
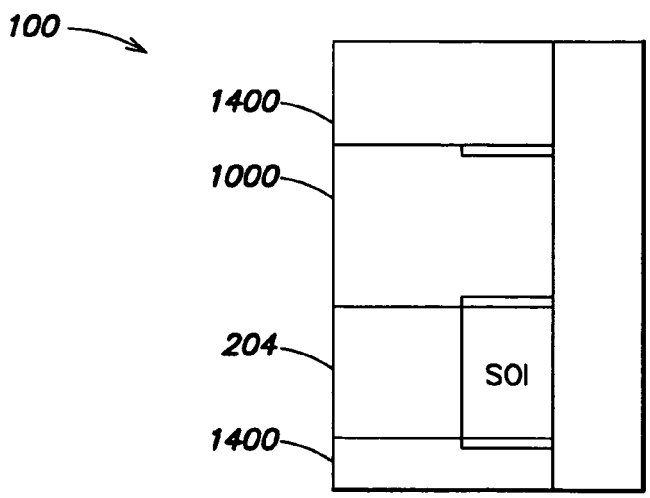

FIGS. 14A-C illustrate respective top, cross-sectional front and cross-sectional side views of a step of the first exemplary method of forming a FinFET in which a second gate conductor is formed on the substrate and planarized in accordance with an embodiment of the present invention. With reference to FIGS. 14A-C, CVD or another suitable method may be employed to deposit a second gate conductor layer 1400 on a top surface of the substrate 100. Thereafter, CMP or another suitable method may be employed to planarize the second gate conductor layer 1400 to a top surface of the oxide layers (e.g., the oxide regions 200-204 and the oxide layer (1002 in FIGS. 10A-C)). An over polish may be employed to remove portions of the second gate conductor layer 1400 atop the first gate conductor layer 1000 and to remove the oxide layer (e.g., oxide cap) 1002 atop the first gate conductor layer 1000. Consequently, top portions of the oxide spacer 500 may be planarized.

The second gate conductor may include at least one of polysilicon (e.g., doped or undoped), a silicide (e.g., nickel silicide or tungsten silicide) and/or a refractory material (e.g., tungsten). However, the second gate conductor may include a larger or smaller number of and/or different materials. The second gate conductor material may determine the work function of a second gate subsequently coupled thereto and a threshold voltage $V_t$ associated with the second gate. In some embodiments, the second gate conductor material may be different than the first gate conductor material (although the first and second gate conductor materials may be the same).

Figure 15A:
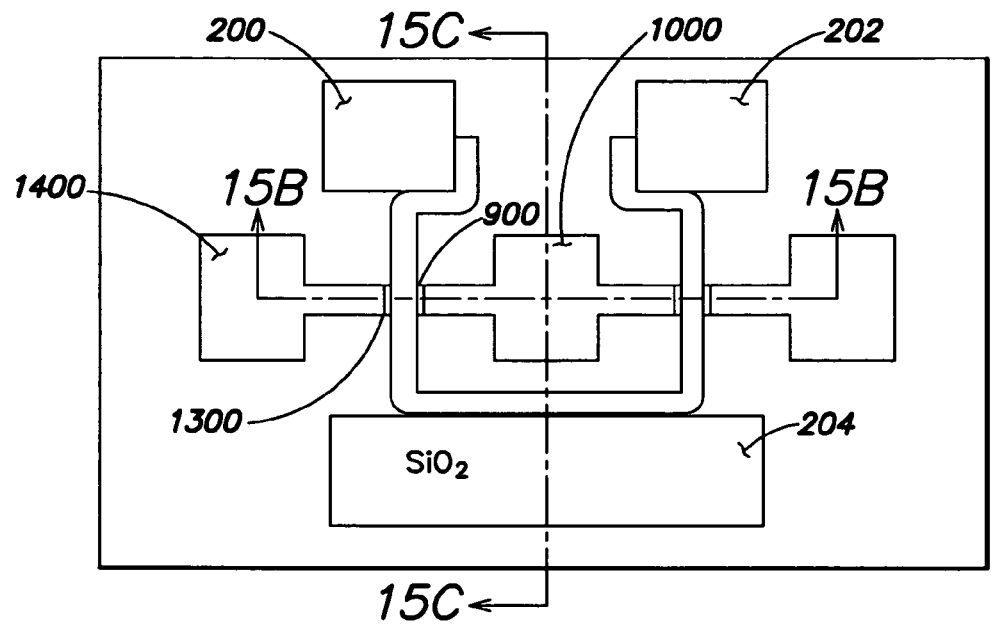
FIGS. 15A-C illustrate respective top, cross-sectional front and cross-sectional side views of a step of the first exemplary method of forming a FinFET in which portions of the gate conductors and gate dielectrics are etched from the substrate in accordance with an embodiment of the present invention.
Figure 15B:
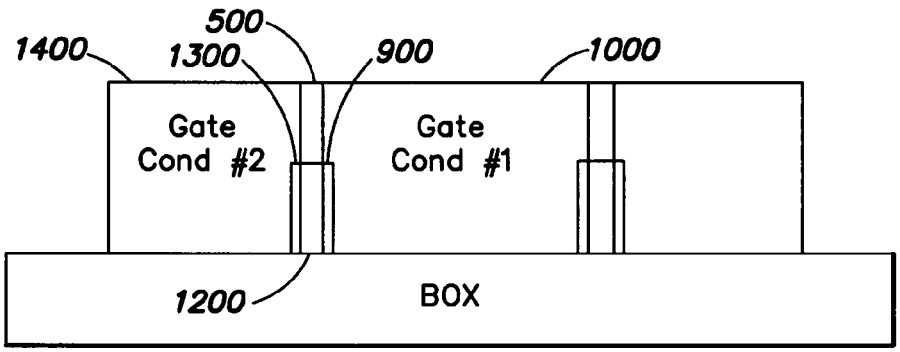
Figure 15C:
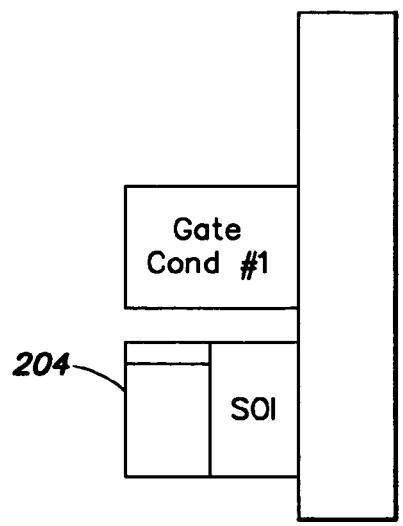

FIGS. 15A-C illustrate respective top, cross-sectional front and cross-sectional side views of a step of the first exemplary method of forming a FinFET in which portions of the gate conductors and gate dielectrics are etched from the substrate in accordance with an embodiment of the present invention. With reference to FIGS. 15A-C, photolithography using photoresist and appropriate masking or another suitable method may be employed to pattern the first and second gate conductor layers 1000, 1400 (e.g., selective to oxide). Consequently, portions of the first and second gate dielectrics 900, 1300 may be exposed. The exposed portions of the first and second gate dielectrics 900, 1300 may be removed (e.g., stripped). Therefore, sidewalls of the silicon beneath the oxide regions 200-204 may be exposed. Gas phase doping, angled ion implantation or another suitable method for doping silicon beneath the one or more of the oxide regions 200-204, which may subsequently form a source or drain diffusion region in the FinFET, may be employed. In this manner, a source, drain or halo dopant may be introduced to silicon beneath one or more of the oxide regions 200-204. Depending on the different types of semiconductor devices that are being manufactured, multiple masking steps may be employed during doping to provide desired doping effects to the different device types. During doping of the silicon beneath the oxide regions 200-204, the oxide spacer 500 overlying the fin 1200 (e.g., fin of silicon) which serves as a conducting channel may prevent the channel from becoming contaminated (e.g., by unwanted dopants).

Figure 16A:
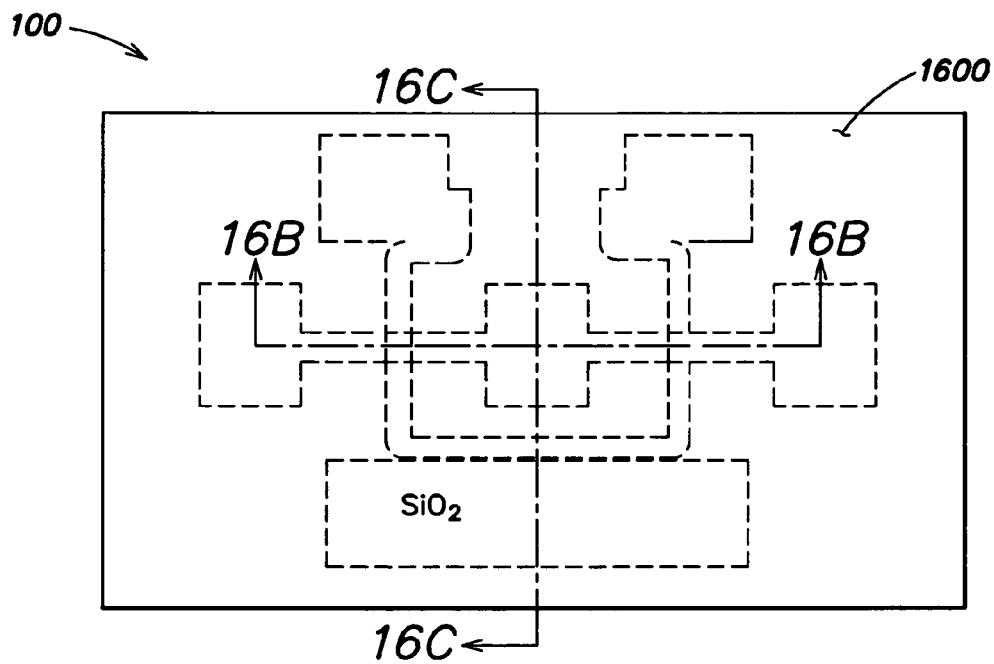
FIGS. 16A-C illustrate respective top, cross-sectional front and cross-sectional side views of a step of the first exemplary method of forming a FinFET in which an insulator is deposited on the substrate in accordance with an embodiment of the present invention.
Figure 16B:
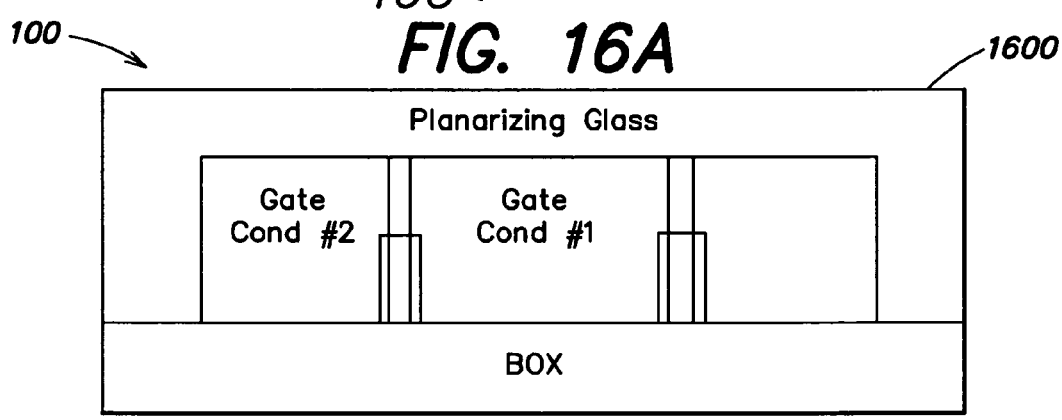
Figure 16C:
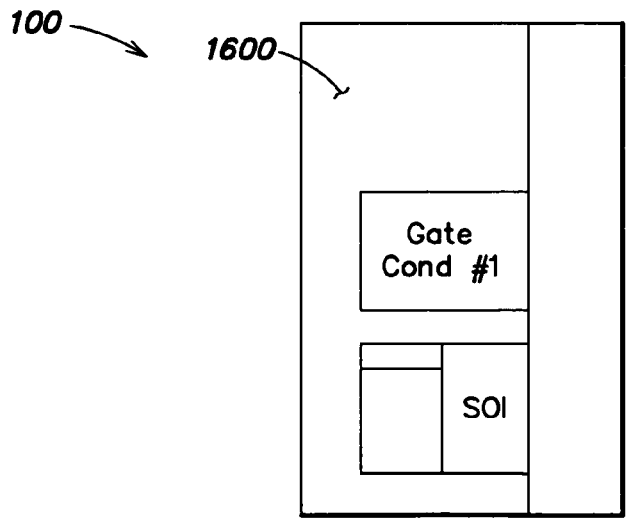

FIGS. 16A-C illustrate respective top, cross-sectional front and cross-sectional side views of a step of the first exemplary method of forming a FinFET in which an insulator is deposited on the substrate in accordance with an embodiment of the present invention. With reference to FIGS. 16A-C, CVD or another suitable method may be employed to deposit an insulator layer 1600, such as a planarizing glass (e.g., phosphosilicate glass (PSG), borosilicate glass (BSG), borophosphosilicate glass (BPSG), etc.) on a top surface of the substrate 100. Thereafter, the insulator layer 1600 may be planarized. In some embodiments, the insulator may be reflowed to planarize the insulator layer 1600. Alternatively, CMP or another suitable method may be employed to planarize the insulator layer 1600. Further, in contrast to the glass described above, in some embodiments, a spin on dielectric or the like may be employed.

Figure 17A:
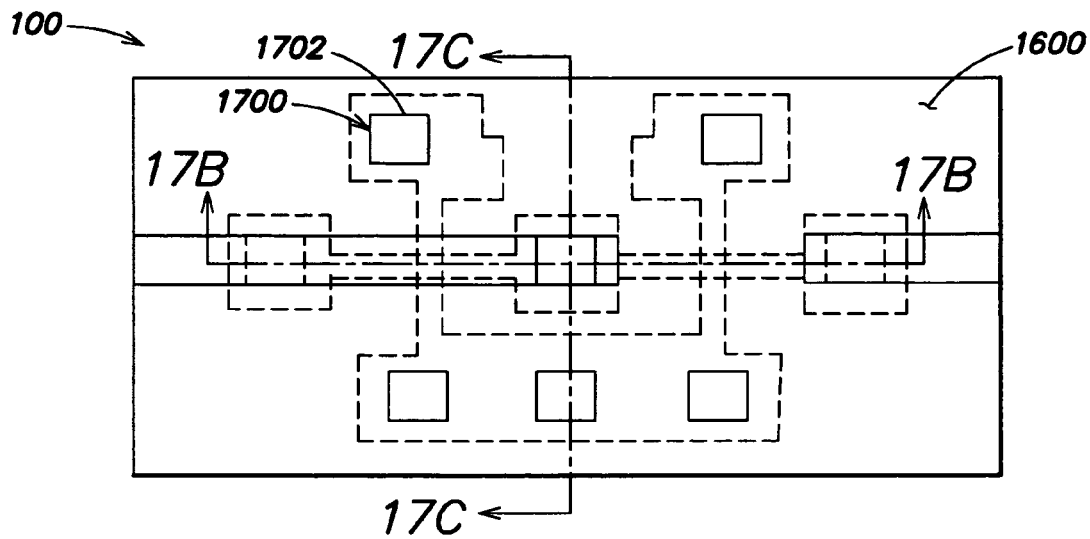
FIGS. 17A-C illustrate respective top, cross-sectional front and cross-sectional side views of a step of the first exemplary method of forming a FinFET in which wiring is formed on a transistor formed in the substrate in accordance with an embodiment of the present invention.
Figure 17B:
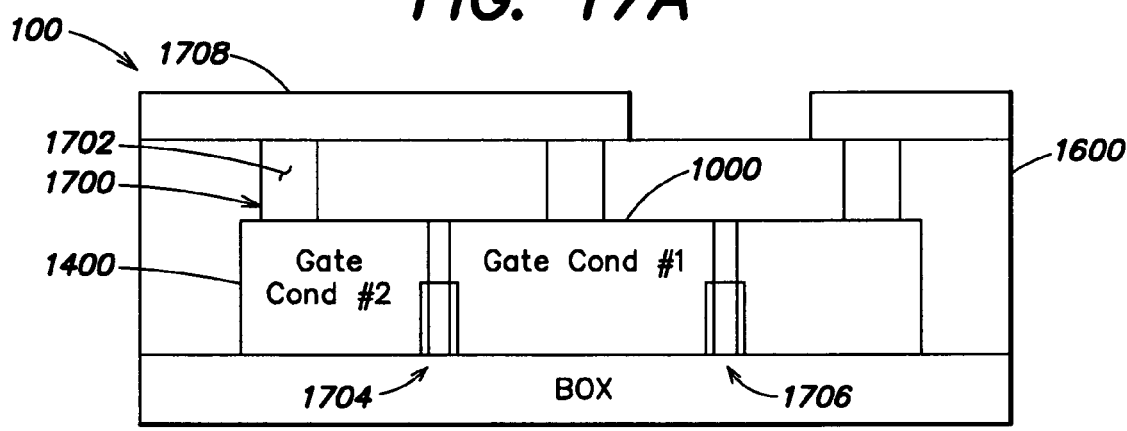
Figure 17C:
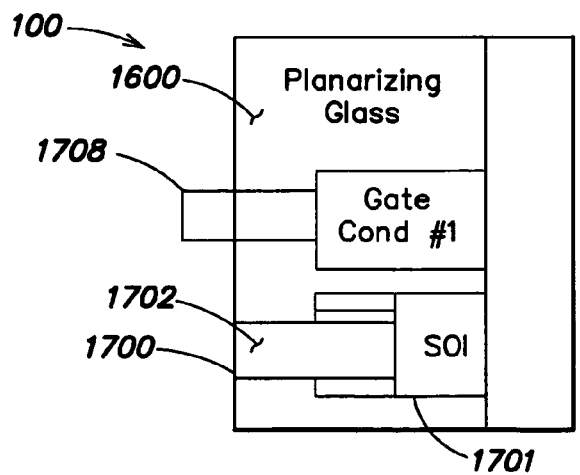

FIGS. 17A-C illustrate respective top, cross-sectional front and cross-sectional side views of a step of the first exemplary method of forming a FinFET in which wiring is formed on a transistor formed in the substrate in accordance with an embodiment of the present invention. With reference to FIGS. 17A-C, masked anisotropic etching, such as RIE, or another suitable method may be employed to etch one or more contact vias 1700 through the insulator layer 1600 (e.g., to the first gate conductor layer 1000, second gate conductor layer 1400, a diffusion region 1701 (e.g., silicon beneath an oxide region 200-204)). Thereafter, contacts 1702 may be formed. Further, metallurgy patterning or another suitable method may be employed to form wiring to one or more of a first gate conductor contact, second gate conductor contact, a source diffusion region contact and/or a drain diffusion region contact. As stated, the first exemplary method may form two FinFETs in the substrate 100 (e.g., a first FinFET 1704 on the left side of the cross-sectional front view and a second FinFET 1706 on the right side of the cross-sectional front view). In some embodiments, a metal bridge 1708 may be formed between gate conductors 1000, 1400 formed on opposing sides of the fin 1200 of the first FinFET 1704. In this manner, the first FinFET 1704 may operate with the same voltage applied to opposing gates (e.g., a first gate coupled to the first gate conductor 1000 and a second gate coupled to the second gate conductor 1400) of the first FinFET 1704 (e.g., similar to operation of a conventional FinFET). In contrast, the wiring of the second FinFET 1706 may be such that opposing gates operate independently. In this manner the present methods and apparatus may provide a "split-gate" FinFET. However, the wiring for the first and/or second FinFET 1704, 1706 may be different. As described above, through use of the first exemplary method a FinFET in accordance with an embodiment of the present invention may be formed.

Figure 18:
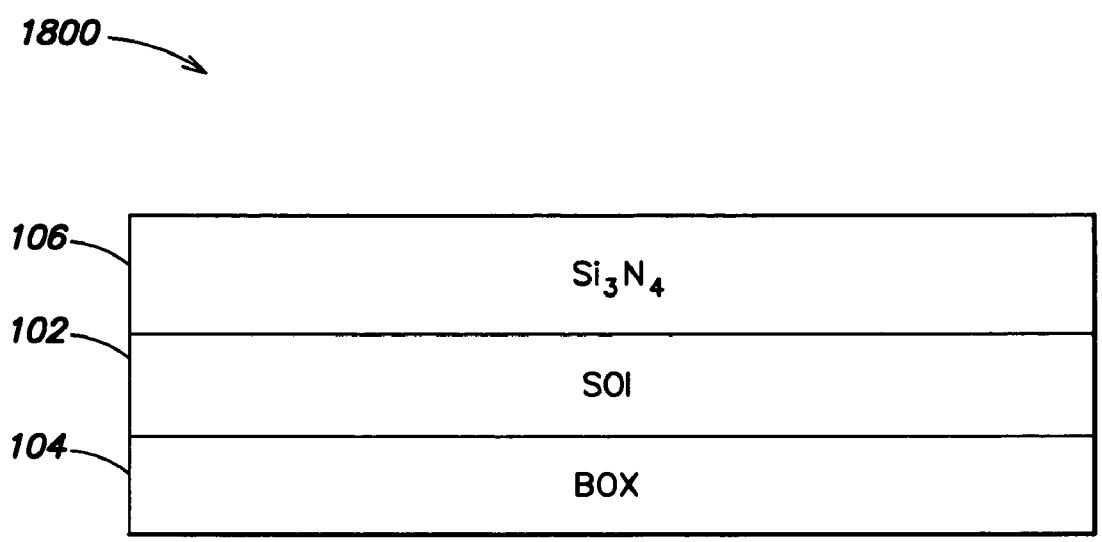
FIG. 18 illustrates a cross-sectional front view of a step of a second exemplary method of forming a FinFET in which nitride is formed on a substrate in accordance with an embodiment of the present invention.

FIGS. 18-34C illustrate a second exemplary method of forming a FinFET in accordance with an embodiment of the present invention. With reference to FIG. 18, similar to the first exemplary method, the second exemplary method may process a silicon-on-oxide (SOI) substrate 1800. The SOI substrate 1800 may include a layer 102 of silicon (SOI layer) formed on oxide, thereby resulting in a buried oxide (BOX) layer 104. For example, during the second exemplary method, a layer of nitride (e.g., pad nitride) such as $Si_3N_4$ or the like may be formed on the substrate 1800. Chemical vapor deposition (CVD) or another suitable method may be employed to form the nitride layer 106. The thickness of the nitride layer 106 may be about 10 nm to about 500 nm (although a larger or smaller thickness may be employed).

Alternatively, in some embodiments, a thin layer of oxide (e.g., pad oxide) (not shown) may be formed on the SOI layer 102, and a layer of pad nitride may be formed as described above on the pad oxide layer. The pad oxide layer may be about 1 nm to about 20 nm thick (although a larger or smaller thickness may be employed).

Figure 19A:
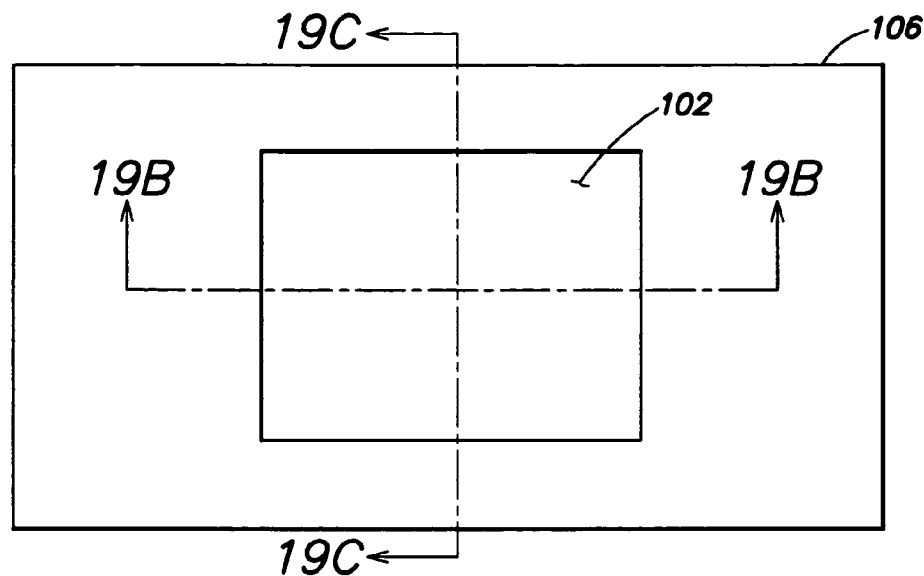
FIGS. 19A-C illustrate respective top, cross-sectional front and cross-sectional side views of a step of the second exemplary method of forming a FinFET in which nitride is etched from the substrate in accordance with an embodiment of the present invention.
Figure 19B:
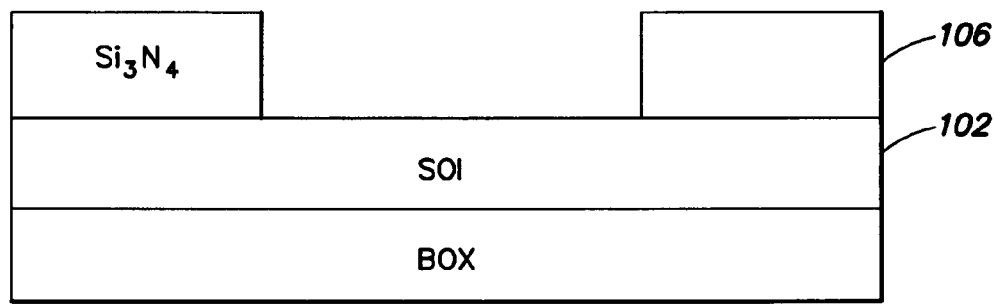
Figure 19C:
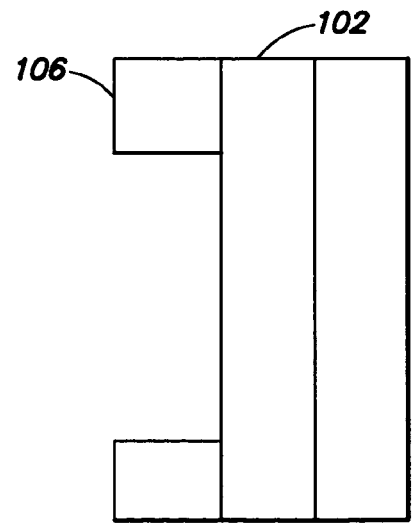

FIGS. 19A-C illustrate respective top, cross-sectional front and cross-sectional side views of a step of the second exemplary method of forming a FinFET in which nitride is etched from the substrate in accordance with an embodiment of the present invention. With reference to FIGS. 19A-C, application and patterning of a photoresist layer, or a hard mask material such as $SiO_2$, followed by a selective RIE or another suitable etch technique may be employed to pattern the nitride layer 106 in FIG. 18 as shown. More specifically, a region (e.g., rectangular region) may be removed from the center of the nitride layer 106 thereby exposing a portion of the SOI layer 102.

Figure 20A:
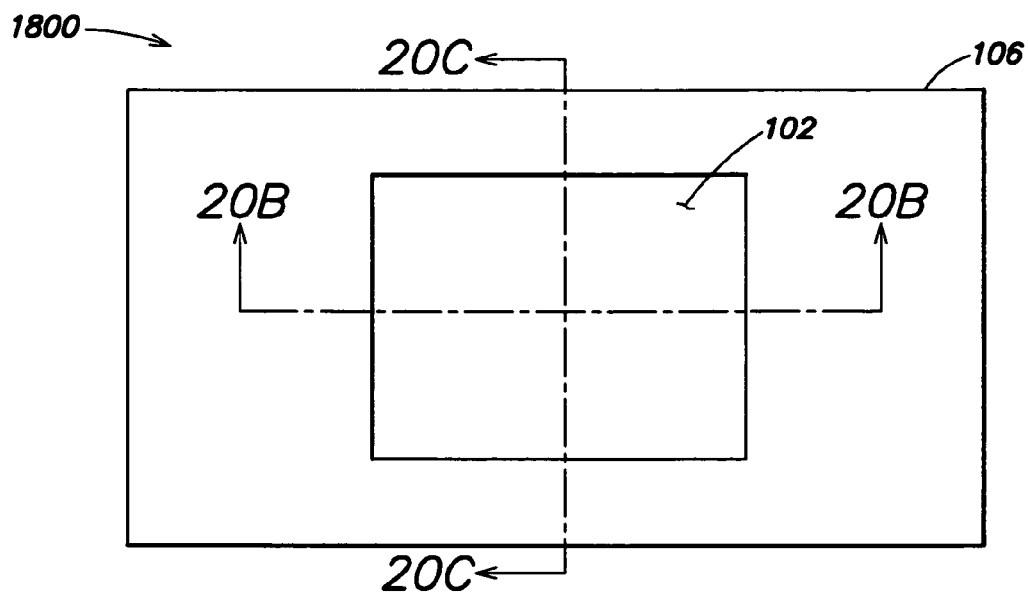
FIGS. 20A-C illustrate respective top, cross-sectional front and cross-sectional side views of a step of the second exemplary method of forming a FinFET in which silicon is etched from the substrate in accordance with an embodiment of the present invention.
Figure 20B:
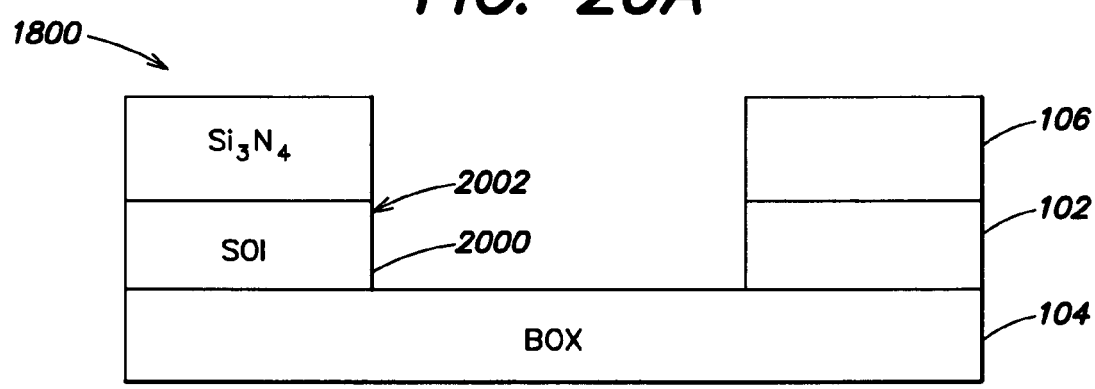
Figure 20C:
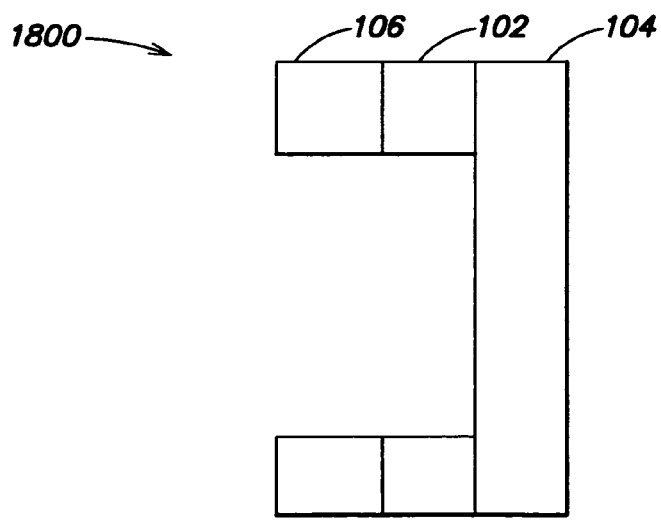

FIGS. 20A-C illustrate respective top, cross-sectional front and cross-sectional side views of a step of the second exemplary method of forming a FinFET in which silicon is etched from the substrate in accordance with an embodiment of the present invention. With reference to FIGS. 20A-C, RIE or another suitable method may be employed to etch the exposed portion of the SOI layer 102 selective to nitride and oxide. In this manner, the exposed portion of the SOI layer 102 may be removed without removing the nitride layer 106, and/or the buried oxide (BOX) layer 104. Consequently, one or more sidewalls 2000 of the SOI layer 102 may be exposed. An exposed sidewall 2000 may serve as a first side 2002 of a subsequently formed fin (2600 in FIG. 26B) of the FinFET being manufactured. While the first side 2002 of the fin is formed, an ultimate second side of the fin is included in the SOI layer 102 and supported thereby. In this manner, a perimeter of the opening formed by removal of the nitride layer may define, in part, a location or one or more fins subsequently formed during the second exemplary method. It should be noted from the cross-sectional front views, that the second exemplary method may form two FinFETs in the substrate 1800 (e.g., a first FinFET on the left side of the cross-sectional front views and a second FinFET on the right side of the cross-sectional front views). For ease of description, when convenient, only the FinFET manufactured on the left side of the cross-sectional front views may be referenced.

Figure 21A:
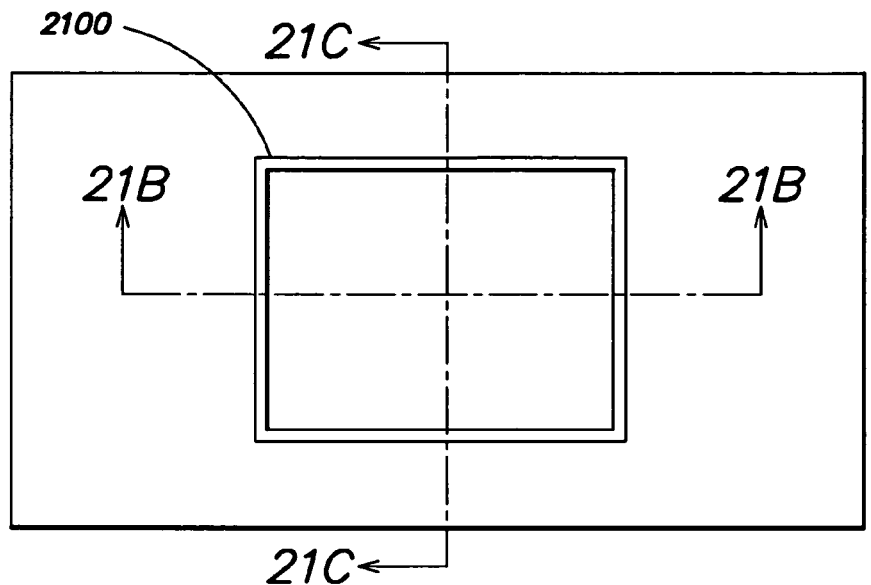
FIGS. 21A-C illustrate respective top, cross-sectional front and cross-sectional side views of a step of the second exemplary method of forming a FinFET in which a first gate dielectric is formed on the substrate in accordance with an embodiment of the present invention.
Figure 21B:
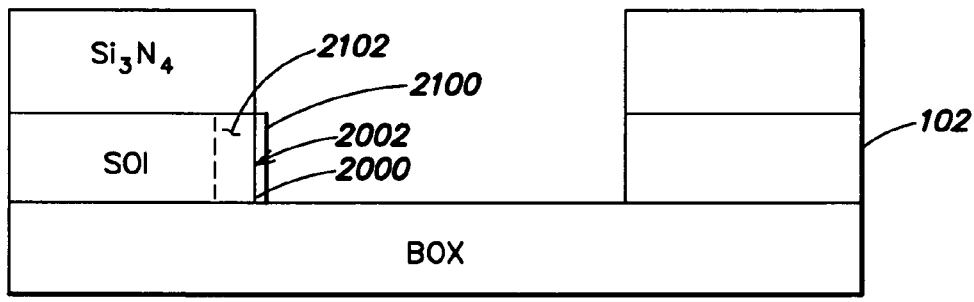
Figure 21C:
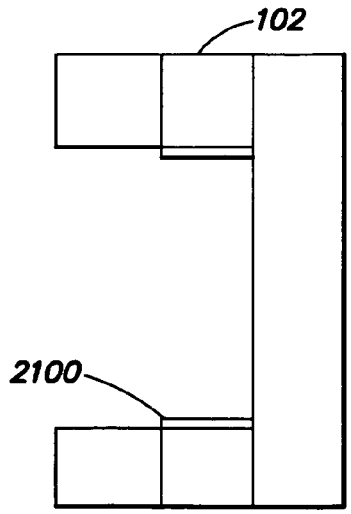

FIGS. 21A-C illustrate respective top, cross-sectional front and cross-sectional side views of a step of the second exemplary method of forming a FinFET in which a first gate dielectric is formed on the substrate in accordance with an embodiment of the present invention. With reference to FIGS. 21A-C, thermal oxidation, thermal nitridation and/or conformal deposition, or another suitable method may be employed to form a first dielectric 2100 on the exposed sidewall 2000 of the SOI layer 102. A portion 2102 (shown in phantom) of the SOI layer 102 on which the first gate dielectric 2100 is formed may subsequently be formed into a fin (2600 in FIG. 26B). In this manner, the first gate dielectric 2100 may be formed on a first side 2002 of the fin. The first gate dielectric 2100 may include at least one of a silicon oxide, silicon oxynitride, silicon nitride and high-k dielectric (e.g., silicon-hafnium-oxynitride). However, the first gate dielectric 2100 may include a larger or smaller number of and/or different gate insulator materials. The electrical thickness of the first gate dielectric 2100 may be about 1 nm to about 6 nm (although a larger or smaller thickness may be employed).

Figure 22A:
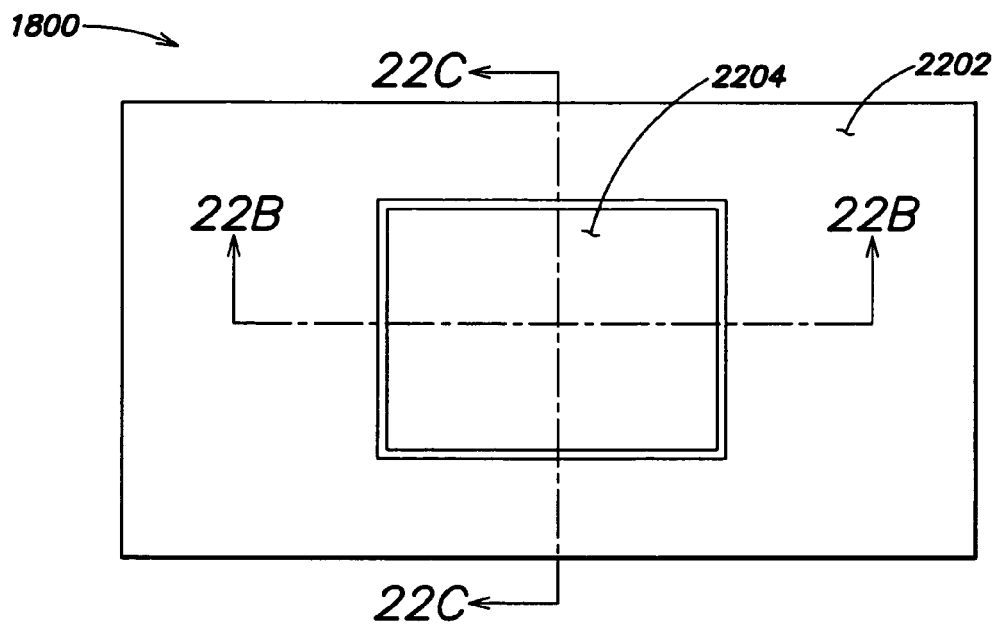
FIGS. 22A-C illustrate respective top, cross-sectional front and cross-sectional side views of a step of the second exemplary method of forming a FinFET in which a first gate conductor is formed on the substrate and an oxide layer is formed on the gate conductor in accordance with an embodiment of the present invention.
Figure 22B:
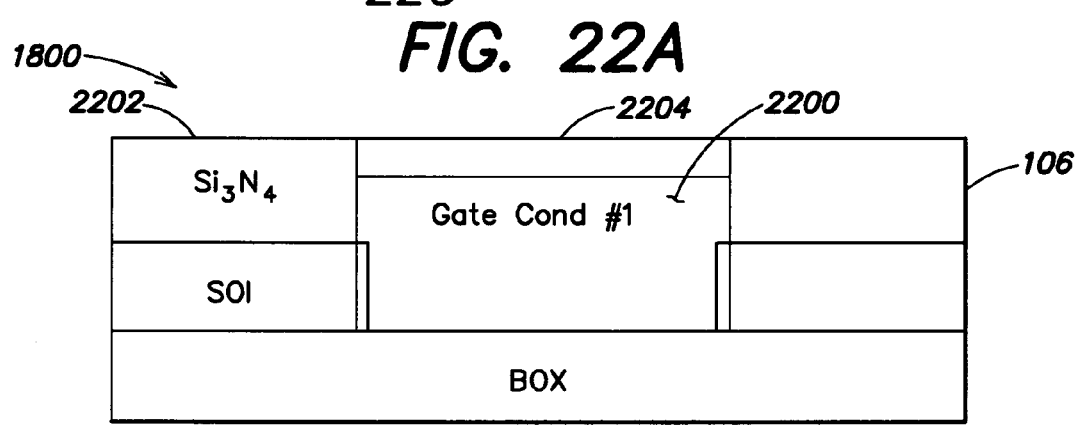
Figure 22C:
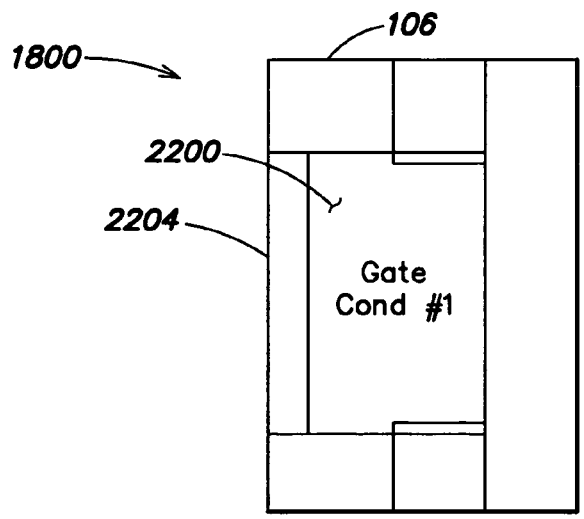

FIGS. 22A-C illustrate respective top, cross-sectional front and cross-sectional side views of a step of the second exemplary method of forming a FinFET in which a first gate conductor is formed on the substrate and an oxide layer is formed on the gate conductor in accordance with an embodiment of the present invention. With reference to FIGS. 22A-C, CVD or another suitable method may be employed to deposit a first gate conductor layer 2200 on a top surface of the substrate 1800. Thereafter, CMP or another suitable method may be employed to planarize the first gate conductor layer 2200 to a top surface 2202 of the nitride layer 106. The first gate conductor may include at least one of polysilicon (e.g., doped or undoped), a silicide (e.g., nickel silicide or tungsten silicide) and/or a refractory material (e.g., tungsten). However, the first gate conductor may include a larger or smaller number of and/or different materials. The first gate conductor material may determine the work function of a first gate subsequently coupled thereto and a threshold voltage $V_t$ associated with the first gate.

RIE or another suitable method may be employed to recess the first gate conductor layer 2200 below a top surface 2202 of the nitride layer 106. For example, the first gate conductor layer 2200 may be recessed about 5 nm to about 50 nm below the top surface 2202 of the nitride layer 106 (although the first gate conductor layer 2200 may be recessed a larger or smaller distance). CVD or another suitable method may be employed to deposit a layer 2204 of oxide on a top surface of the substrate 1800. CMP or another suitable method may be employed to planarize the oxide layer 2204 to a top surface 2202 of the nitride layer 106. In this manner, the oxide layer 2204 may serve as a protective cap for the first gate conductor layer 2200.

Figure 23A:
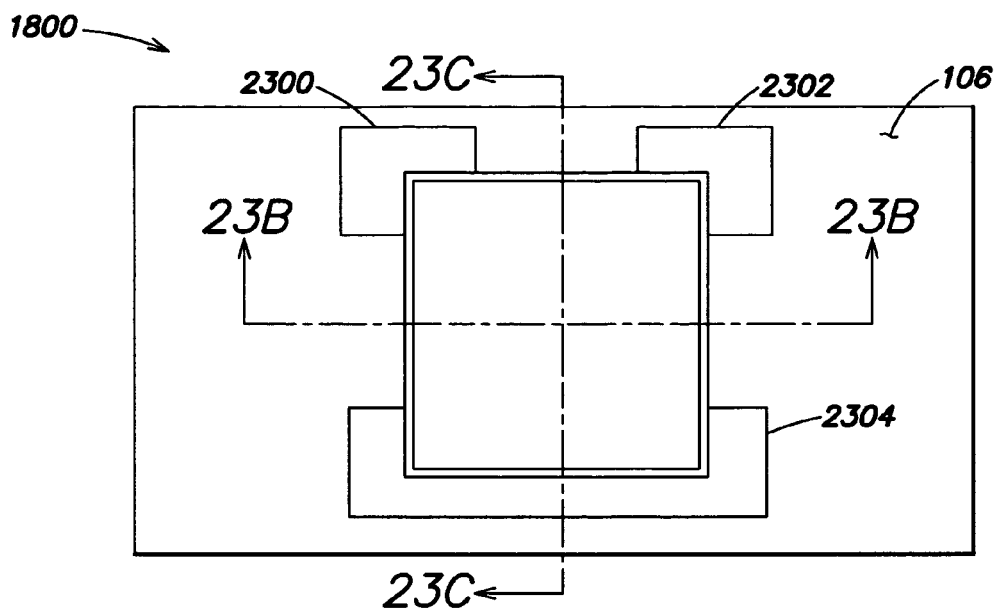
FIGS. 23A-C illustrate respective top, cross-sectional front and cross-sectional side views of a step of the second exemplary method of forming a FinFET in which oxide regions are formed in the nitride of the substrate in accordance with an embodiment of the present invention.
Figure 23B:
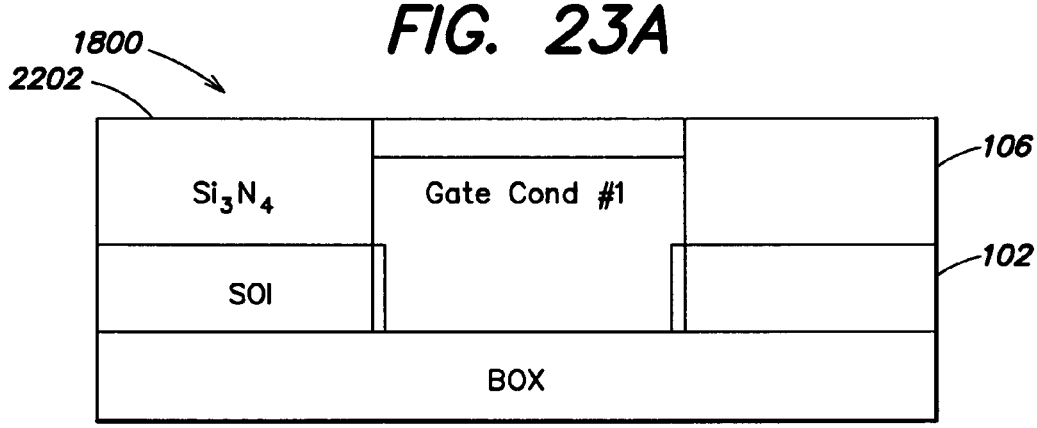
Figure 23C:
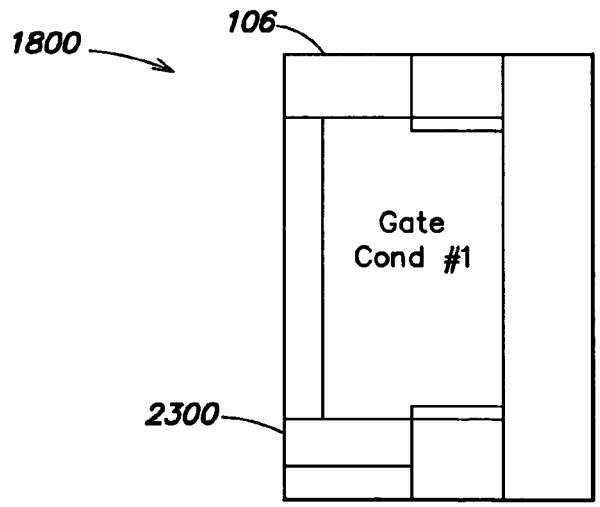

FIGS. 23A-C illustrate respective top, cross-sectional front and cross-sectional side views of a step of the second exemplary method of forming a FinFET in which oxide regions 2300-2304 are formed in the nitride of the substrate 1800 in accordance with an embodiment of the present invention. With reference to FIGS. 23A-C, oxide regions 2300-2304 may be formed by patterning openings onto the nitride layer 106 using a patterning technique such as photolithography using photoresist and appropriate masking. For example, portions of the nitride layer 106 may be exposed through use of a mask employed during the patterning technique. Thereafter, RIE or another suitable method may be employed to remove portions of the nitride layer 106 exposed through the openings selective to silicon. Therefore, the etching of exposed nitride in the nitride layer 106 may stop at silicon of the SOI layer 102.

Oxide (e.g., $SiO_2$) may be deposited on the substrate 1800 using CVD or another suitable deposition method such that the oxide is deposited in the regions 2300-2304. Thereafter, CMP or another suitable technique may be employed to planarize a top surface of the substrate 1800 to a top surface 2202 of the nitride layer 106. In this manner, the oxide regions 2300-2304 may be formed. The oxide regions 2300-2304 may define regions for subsequently formed pads (e.g., contact pads) to contact a source or drain diffusion region of the substrate 1800. For example, a first and second oxide region 2300, 2302 may define regions for subsequently formed pads to contact first and second drain diffusion regions (e.g., regions of silicon beneath the first and second oxide regions 2300, 2302), respectively, of the substrate 1800. Similarly, a third oxide region 2304 may define a region for a subsequently formed pad to contact a source diffusion region (e.g., a region of silicon beneath the third oxide region 2304) of the substrate 1800. In this manner, damascened regions may be formed which may serve as etch masks when subsequently defining one or more contact pads.

Figure 24A:
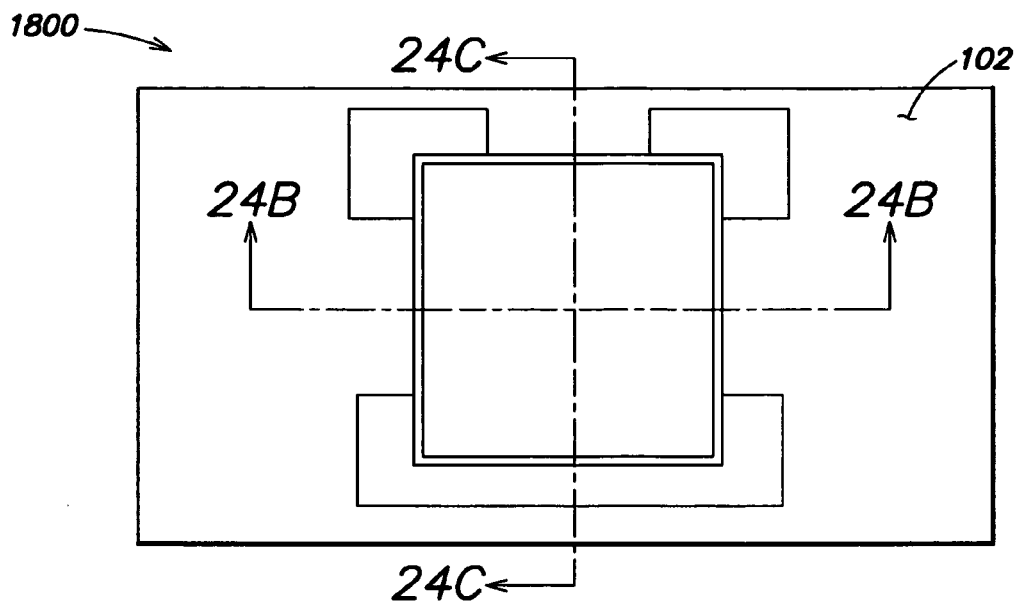
FIGS. 24A-C illustrate respective top, cross-sectional front and cross-sectional side views of a step of the second exemplary method of forming a FinFET in which nitride is etched from the substrate in accordance with an embodiment of the present invention.
Figure 24B:
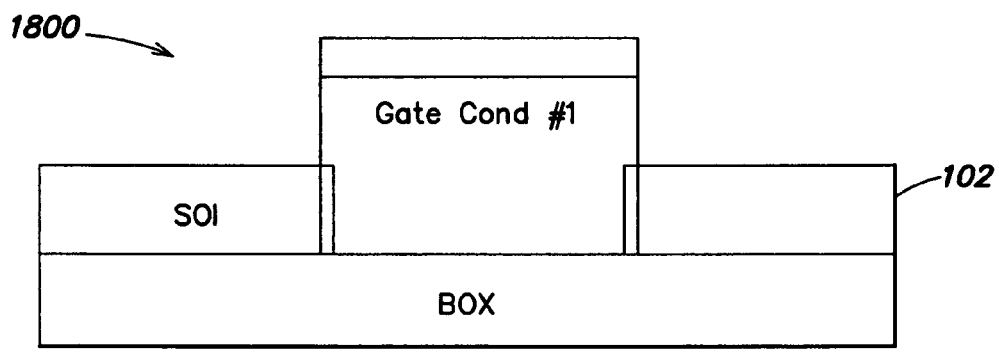
Figure 24C:
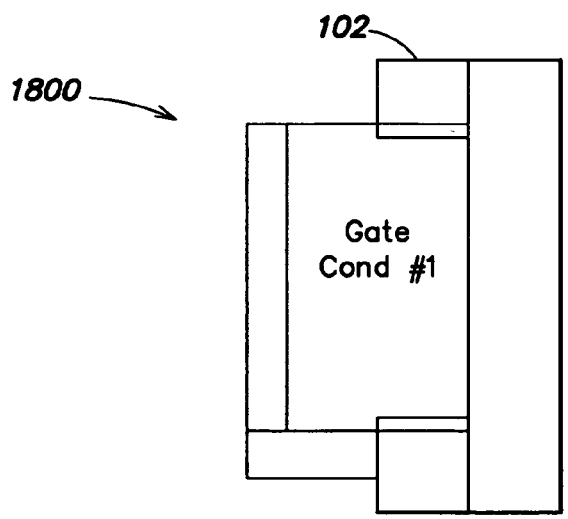

FIGS. 24A-C illustrate respective top, cross-sectional front and cross-sectional side views of a step of the second exemplary method of forming a FinFET in which nitride is etched from the substrate in accordance with an embodiment of the present invention. With reference to FIGS. 24A-C, RIE or another suitable method may be employed to etch nitride selective to oxide and silicon. In this manner, exposed portions of the nitride layer (106 in FIGS. 23A-C) may be etched (e.g., down to the SOI layer 102), and thereby removed from the substrate 1800.

Figure 25A:
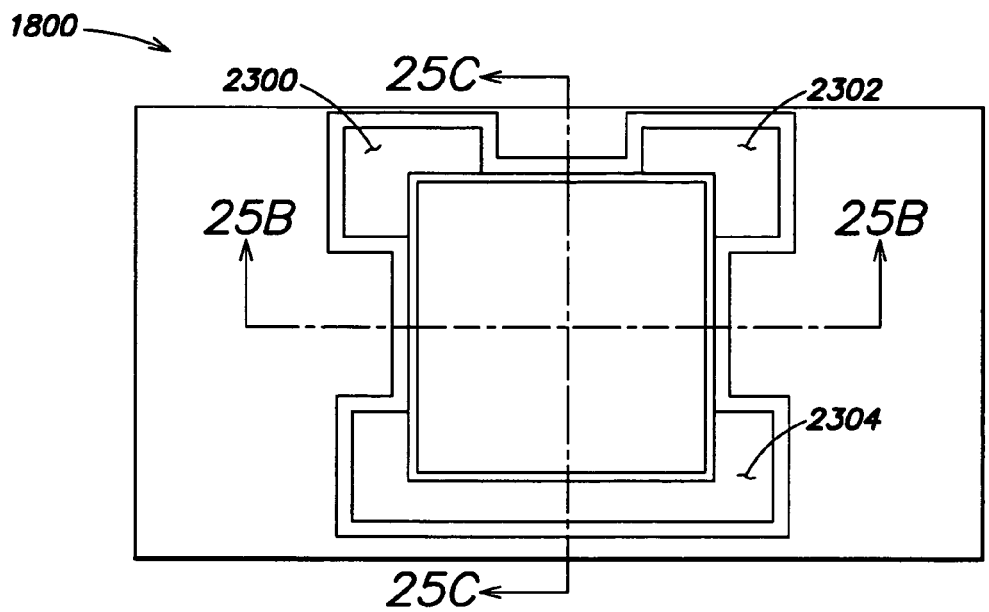
FIGS. 25A-C illustrate respective top, cross-sectional front and cross-sectional side views of a step of the second exemplary method of forming a FinFET in which oxide spacers are formed on the substrate in accordance with an embodiment of the present invention.
Figure 25B:
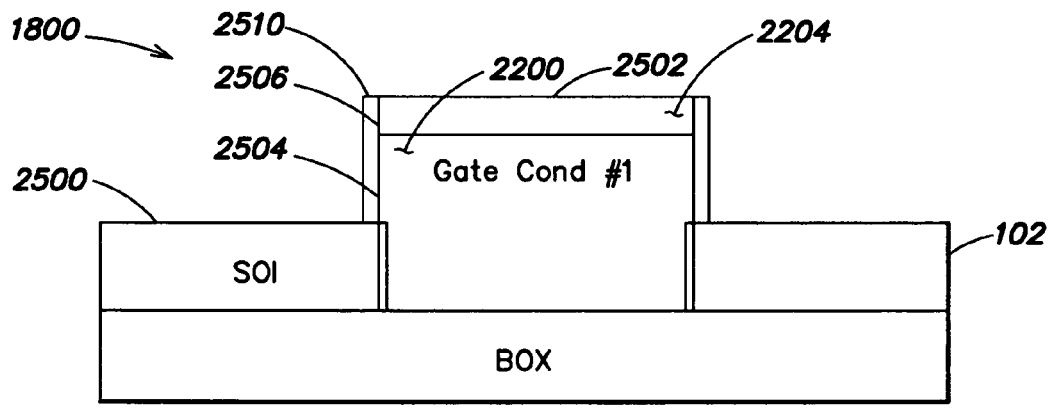
Figure 25C:
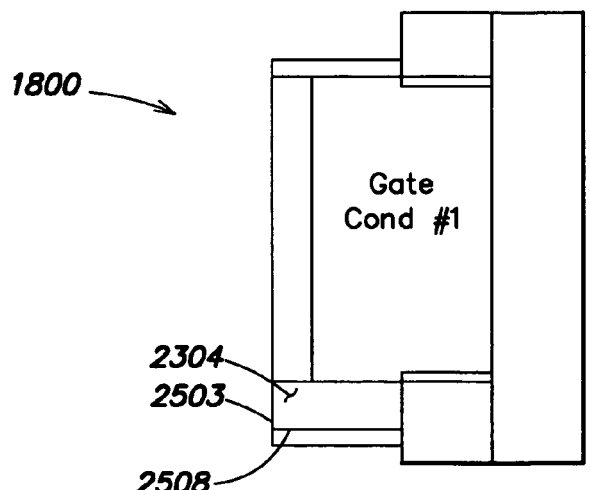

FIGS. 25A-C illustrate respective top, cross-sectional front and cross-sectional side views of a step of the second exemplary method of forming a FinFET in which oxide spacers are formed on the substrate in accordance with an embodiment of the present invention. With reference to FIGS. 25A-C, CVD or another suitable technique may be employed to deposit (e.g., conformally) a layer of oxide over a top surface of the substrate 1800. In this manner, a layer of oxide may form on exposed portions of a top surface 2500 of the SOI layer 102, exposed portions of a top surface 2502 of the oxide layer 2204 (e.g., protective cap), exposed portions of a top surface 2503 of the oxide regions 2300-2304 exposed sidewalls 2504 of the first gate conductor 2200, exposed sidewalls 2506 of the oxide layer 2204 and/or exposed sidewalls 2508 of the oxide regions 2300-2304. Thereafter, RIE or another suitable etching method may be employed to etch the oxide layer selective to nitride. For example, portions of the oxide layer deposited on the top surface 2500 of the SOI layer 102, the top surface 2502 of the oxide layer 2204 and/or top surface 2503 of the oxide regions 2300-2304 may be removed. In this manner, oxide spacers 2510 may be formed on sidewalls (e.g., vertical sidewalls) of the first gate conductor 2200, exposed sidewalls 2506 of the oxide layer 2204 and/or exposed sidewalls 2508 of the oxide regions 2300-2304.

The thickness of the deposited layer of oxide may determine a width of the oxide spacer, which may determine a width of one or more fins that are subsequently formed. In one embodiment, the thickness of the deposited layer of oxide, and therefore, the oxide spacers 2510 may be about 2 nm to about 50 nm. However, a larger or smaller thickness may be employed.

Figure 26A:
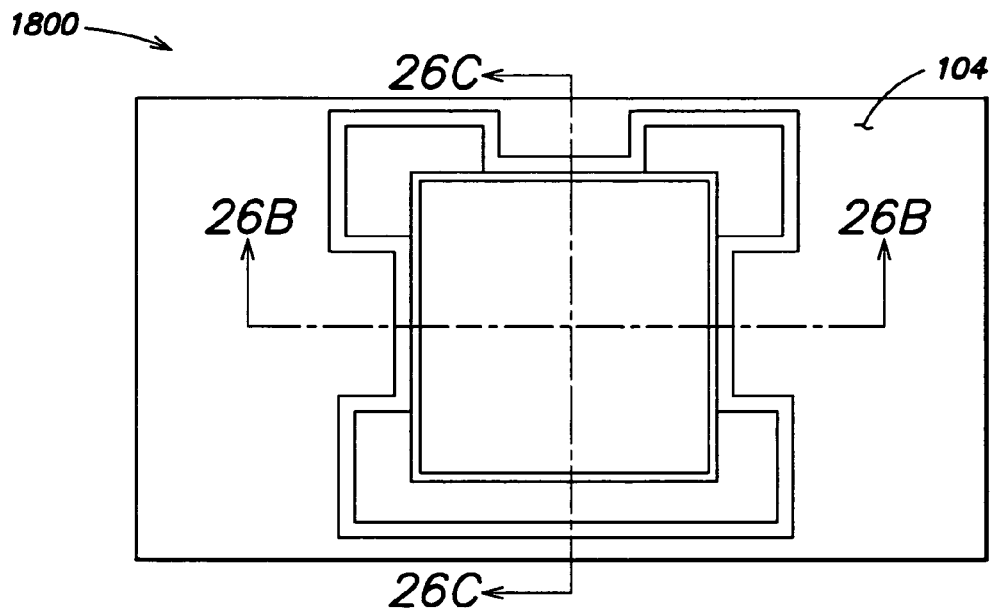
FIGS. 26A-C illustrate respective top, cross-sectional front and cross-sectional side views of a step of the second exemplary method of forming a FinFET in which silicon is etched from the substrate in accordance with an embodiment of the present invention.
Figure 26B:
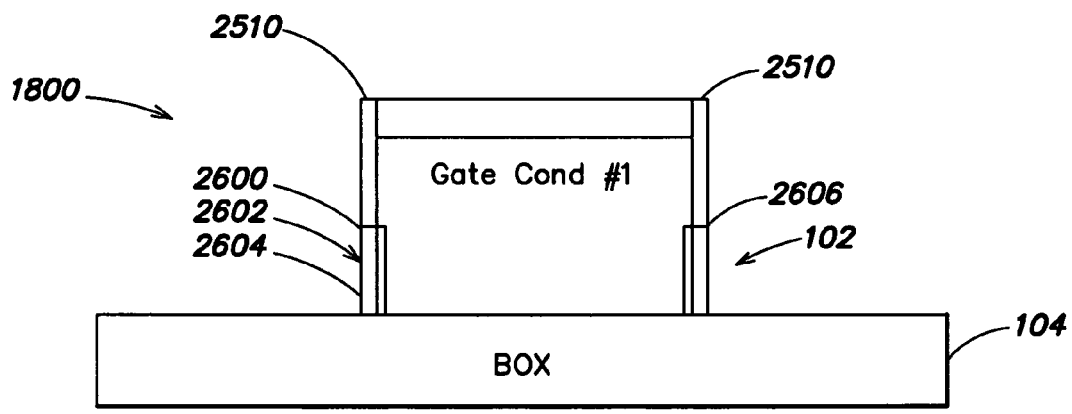
Figure 26C:
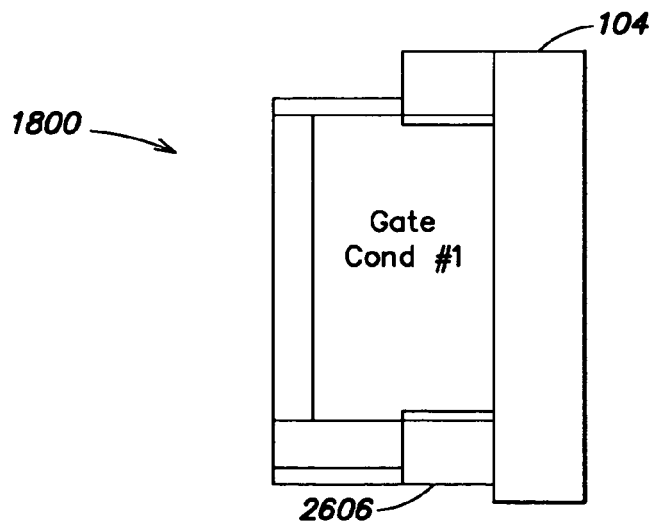

FIGS. 26A-C illustrate respective top, cross-sectional front and cross-sectional side views of a step of the second exemplary method of forming a FinFET in which silicon is etched from the substrate in accordance with an embodiment of the present invention. RIE or another suitable method may be employed to etch silicon selective to oxide. In this manner, exposed portions of the SOI layer 102 may be etched (e.g., down to the BOX layer 104), and thereby removed from the substrate 1800. Consequently, a fin 2600 of the FinFET (e.g., a first FinFET) being manufactured may be formed. More specifically, the silicon etching causes one or more sidewalls 2602 of the SOI layer 102 to be exposed. A sidewall 2602 of the SOI layer may serve as a second side 2604 of the fin 2600. In this manner, the fin 2600 of the FinFET may be formed. It should be noted while the second side 2604 of the fin 2600 is formed, the first gate conductor layer 2200 and first dielectric layer 2100 support the first side 2002 of the fin 2600. The width of the fin 2600 may be defined by the oxide spacer 2510 overlying the fin 2600. Additionally, the silicon etching may form diffusion landing pad regions (e.g., rectangular regions) to which subsequently formed contacts may couple. It should be noted that a fin 2606 of another FinFET (e.g., a second FinFET) that may be manufactured may also be formed in this step. Doping similar to that described with reference to FIGS. 8A-C may now be employed.

Figure 27A:
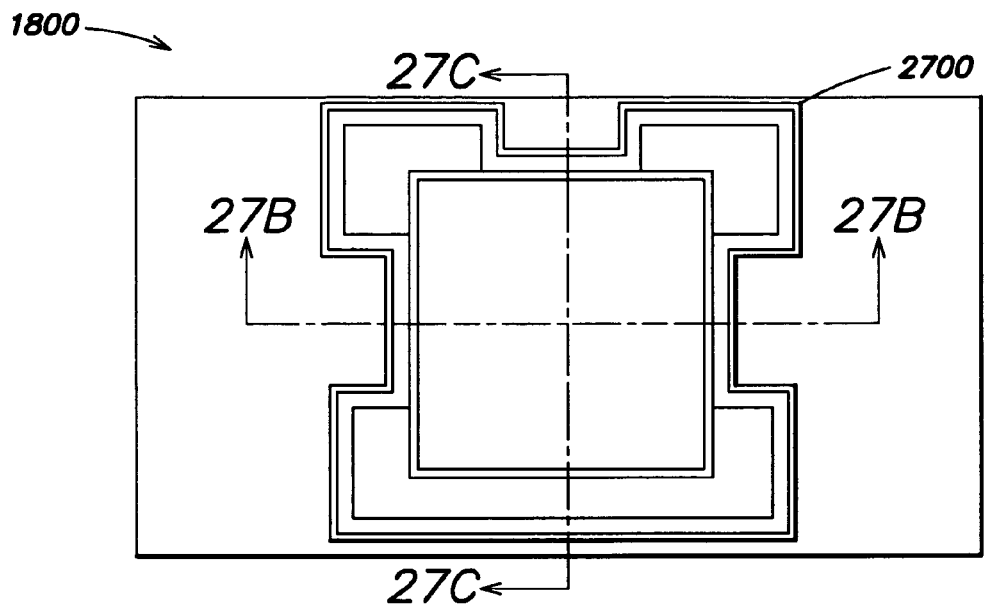
FIGS. 27A-C illustrate respective top, cross-sectional front and cross-sectional side views of a step of the second exemplary method of forming a FinFET in which a second gate dielectric is formed on the substrate in accordance with an embodiment of the present invention.
Figure 27B:
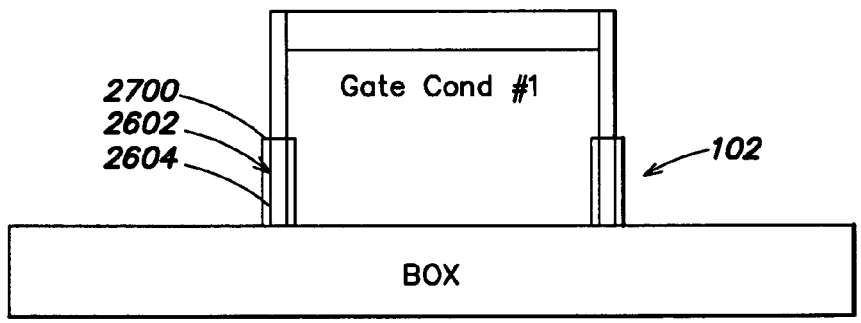
Figure 27C:
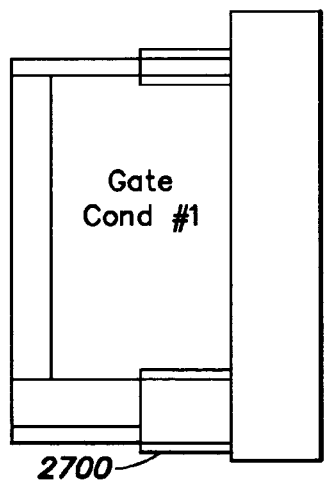

FIGS. 27A-C illustrate respective top, cross-sectional front and cross-sectional side views of a step of the second exemplary method of forming a FinFET in which a second gate dielectric is formed on the substrate in accordance with an embodiment of the present invention. With reference to FIGS. 27A-C, thermal oxidation, thermal nitridation and/or conformal deposition, or another suitable method may be employed to form a second dielectric 2700 on the sidewall 2602 of the SOI layer 102. In this manner, the second gate dielectric 2700 may be formed on the second side 2604 of the fin 2600. The second gate dielectric 2700 may include at least one of a silicon oxide, silicon oxynitride, silicon nitride and high-k dielectric (e.g., silicon-hafnium-oxynitride). However, the second gate dielectric 2700 may include a larger or smaller number of and/or different gate insulator materials. The electrical thickness of the second gate dielectric 2700 may be about 1 nm to about 6 nm (although a larger or smaller thickness may be employed). In some embodiments, the second gate dielectric material and/or width may be different than the first gate dielectric material and/or width, respectively (although the first and second gate dielectrics may be of the same material).

Figure 28A:
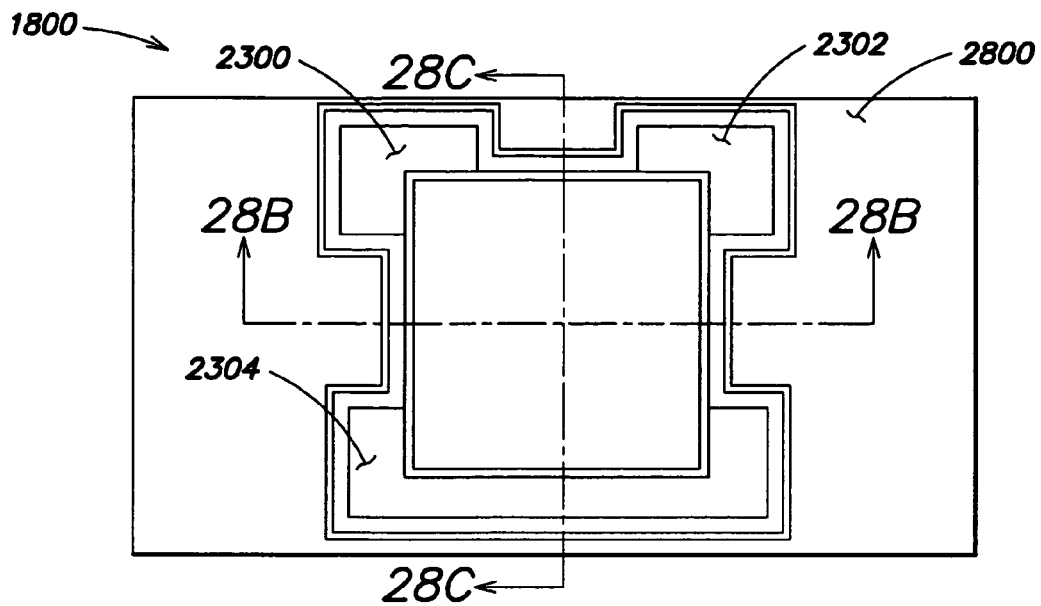
FIGS. 28A-C illustrate respective top, cross-sectional front and cross-sectional side views of a step of the second exemplary method of forming a FinFET in which a second gate conductor is formed on the substrate and planarized in accordance with an embodiment of the present invention.
Figure 28B:
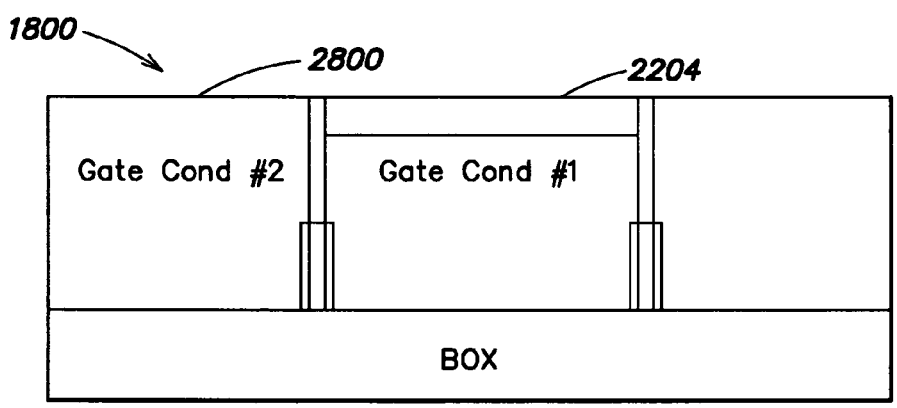
Figure 28C:
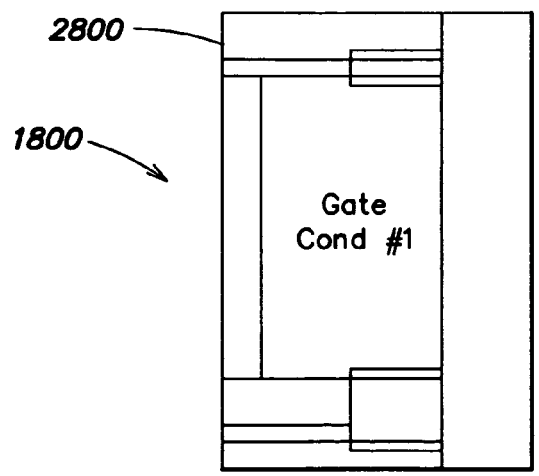
Figure 29A:
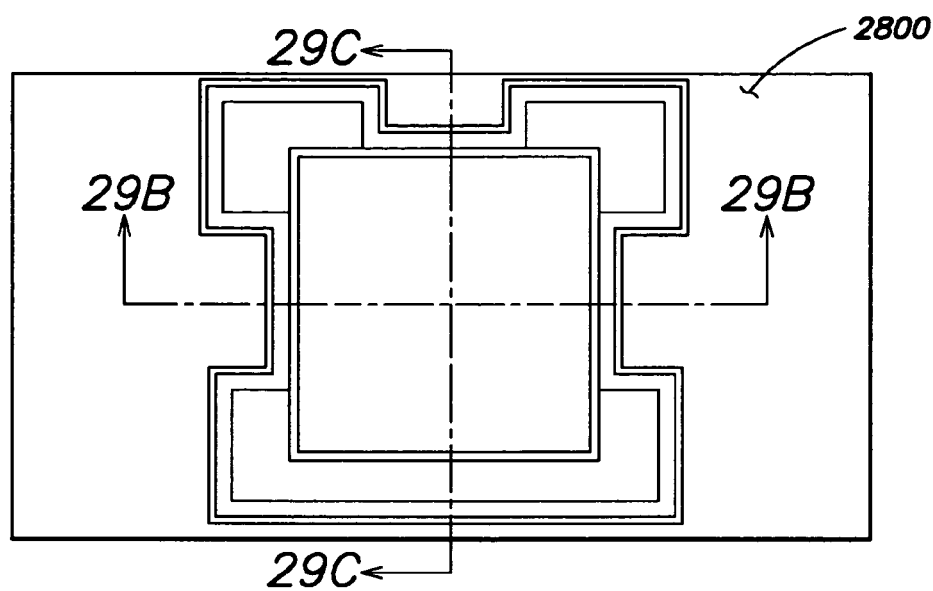
FIGS. 29A-C illustrate respective top, cross-sectional front and cross-sectional side views of a step of the second exemplary method of forming a FinFET in which oxide and the second gate conductor are planarized in accordance with an embodiment of the present invention.
Figure 29B:
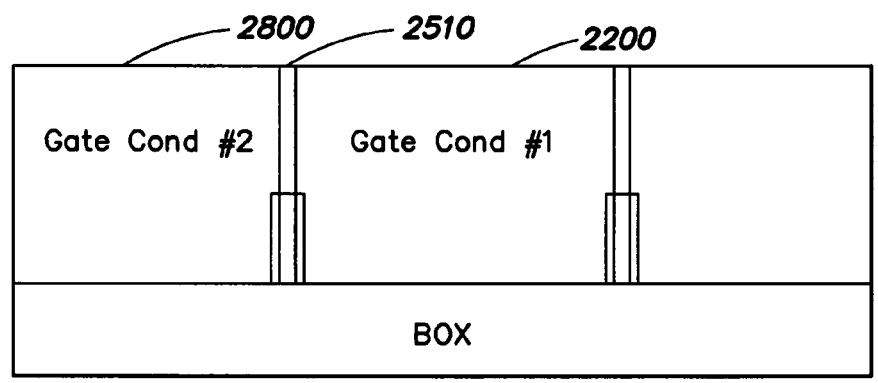
Figure 29C:
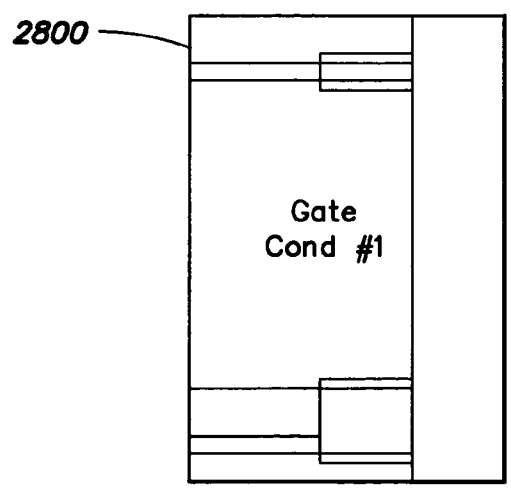

FIGS. 28A-C illustrate respective top, cross-sectional front and cross-sectional side views of a step of the second exemplary method of forming a FinFET in which a second gate conductor is formed on the substrate and planarized in accordance with an embodiment of the present invention. With reference to FIGS. 28A-C, CVD or another suitable method may be employed to deposit a second gate conductor layer 2800 on a top surface of the substrate 1800. Thereafter, CMP or another suitable method may be employed to planarize the second gate conductor layer 2800 to a top surface of the oxide layers (e.g., the oxide regions 2300-2304 in FIG. 25A and the oxide layer 2204). FIGS. 29A-C illustrate respective top, cross-sectional front and cross-sectional side views of a step of the second exemplary method of forming a FinFET in which oxide and the second gate conductor are planarized in accordance with an embodiment of the present invention. With reference to FIGS. 29A-C, an over polish may be employed to remove (e.g., planarize) portions of the second gate conductor layer 2800 atop the first gate conductor layer 2200 and to remove the oxide layer (e.g., oxide cap) (2204 in FIG. 28B) atop the first gate conductor layer 2200. Consequently, top portions of the oxide spacer 2510 may be planarized. The second gate conductor may include at least one of polysilicon (e.g., doped or undoped), a silicide (e.g., nickel silicide or tungsten silicide) and/or a refractory material (e.g., tungsten). However, the second gate conductor may include a larger or smaller number of and/or different materials. The second gate conductor material may determine the work function of a second gate subsequently coupled thereto and a threshold voltage $V_t$ associated with the second gate. In some embodiments, the second gate conductor material may be different than the first gate conductor material (although the first and second gate conductor materials may be the same).

Figure 30A:
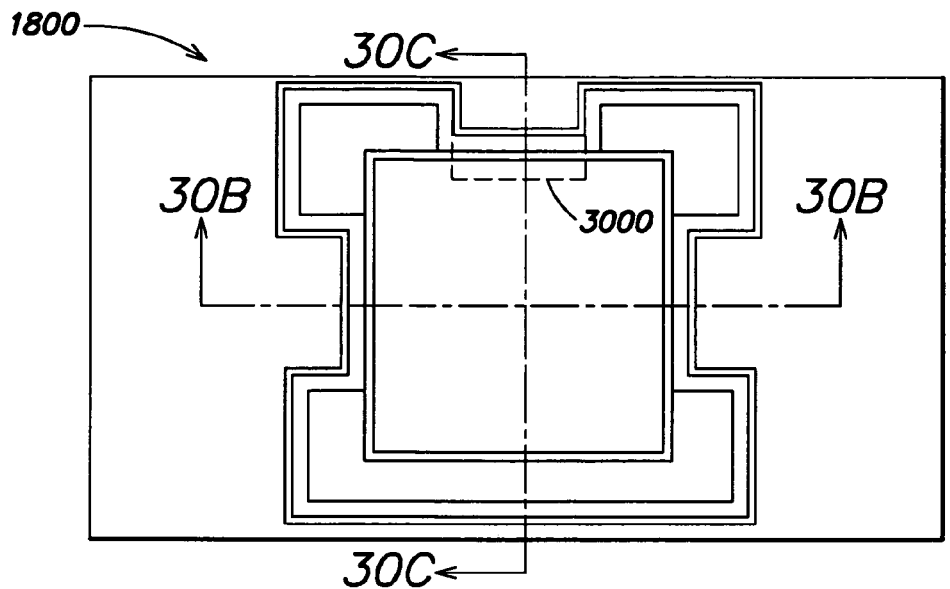
FIGS. 30A-C illustrate respective top, cross-sectional front and cross-sectional side views of a step of the second exemplary method of forming a FinFET in which oxide above a fin is etched from the substrate in accordance with an embodiment of the present invention.
Figure 30B:
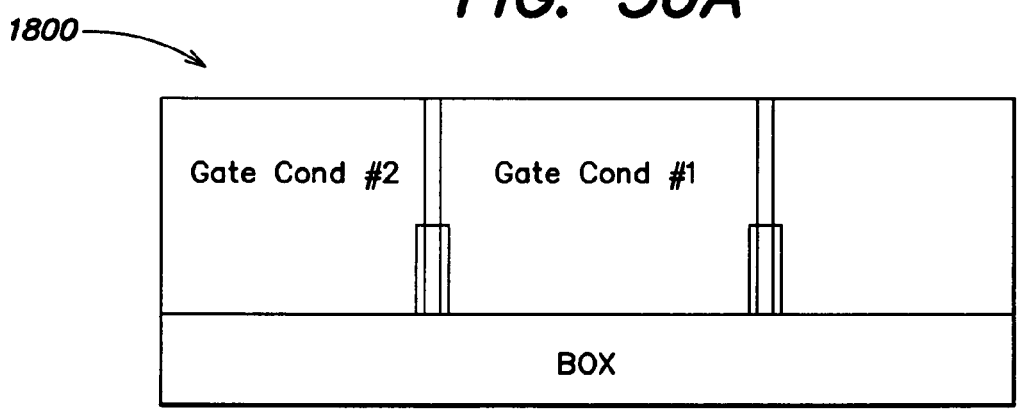
Figure 30C:
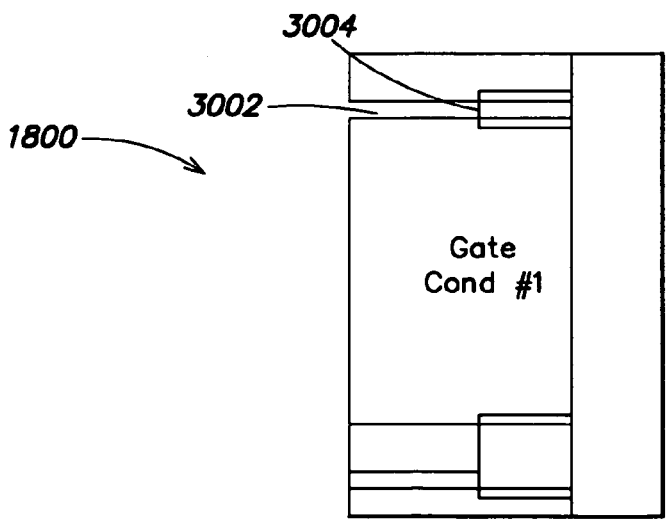

FIGS. 30A-C illustrate respective top, cross-sectional front and cross-sectional side views of a step of the second exemplary method of forming a FinFET in which oxide above a fin is etched from the substrate in accordance with an embodiment of the present invention. With reference to FIGS. 30A-C, an etching mask 3000 may be formed on the substrate 1800. For example, a photoresist layer may be applied to the substrate 1800 and patterned to form the etching mask 3000. Thereafter, the etching mask 3000 may be employed with a suitable etching method to selectively etch an opening 3002 in an oxide spacer 2510 overlying a fin 3004. The opening 3002 may enable subsequent access to the fin 3004, for example, during patterning of the gate conductor layers 2200, 2800. In this manner, such fin 3004 may be selectively cut in what is known as a trimming operation.

Figure 31A:
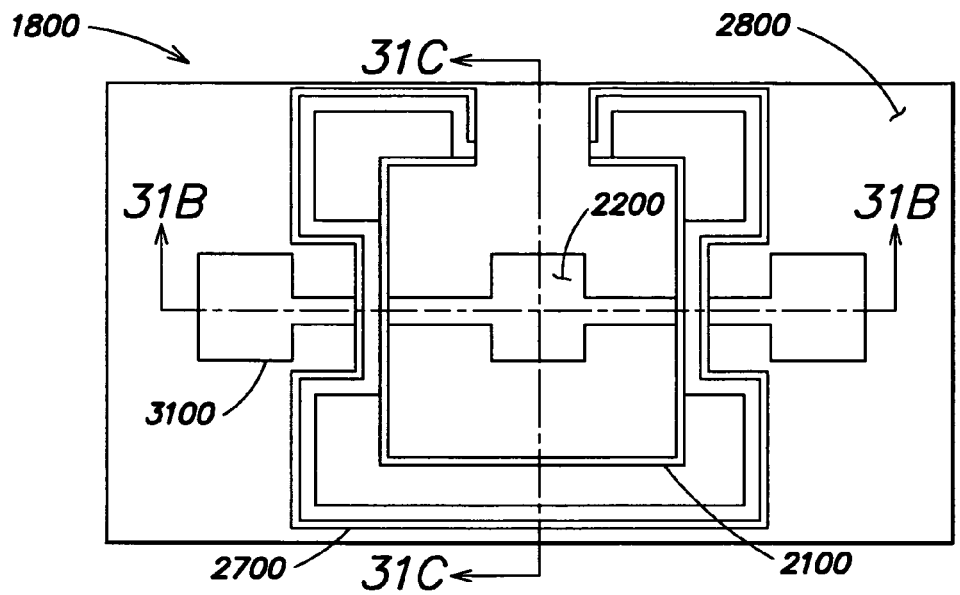
FIGS. 31A-C illustrate respective top, cross-sectional front and cross-sectional side views of a step of the second exemplary method of forming a FinFET in which a fin and portions of the first and second gate conductors are etched from the substrate in accordance with an embodiment of the present invention.
Figure 31B:
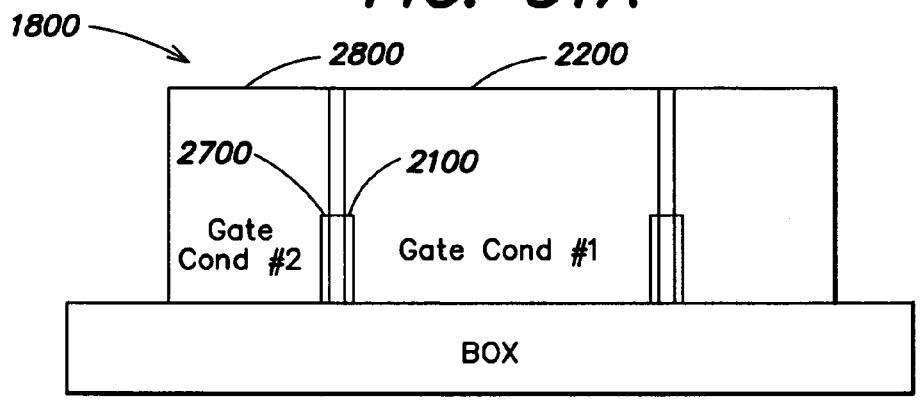
Figure 31C:
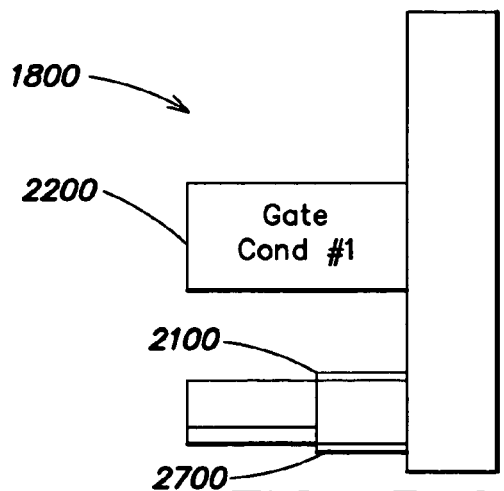

FIGS. 31A-C illustrate respective top, cross-sectional front and cross-sectional side views of a step of the second exemplary method of forming a FinFET in which a fin and portions of the first and second gate conductors are etched from the substrate in accordance with an embodiment of the present invention. With reference to FIGS. 31A-C, an anisotropic etch such as RIE, a combination of an anisotropic and an isotropic etch selective to oxide and nitride, or another suitable method may be employed to pattern the first and second gate conductor layers 2200, 2800 (e.g., selective to oxide) into a resulting region 3100. Consequently, portions of the first and second gate dielectrics 2100, 2700 may be exposed. Additionally, one or more portions of the fin (3004 in FIG. 30C) exposed by the opening (3002 in FIG. 30C) may also be removed while the gate conductor layers 2200, 2800 are etched. Removing the fin 3004 may cause portions of the gate dielectric layers 2100, 2700 previously coupled to the fin 3004 to be left free standing. Therefore, such portions of the dielectric layers 2100, 2700 may fall off of the substrate 1800.

Figure 32A:
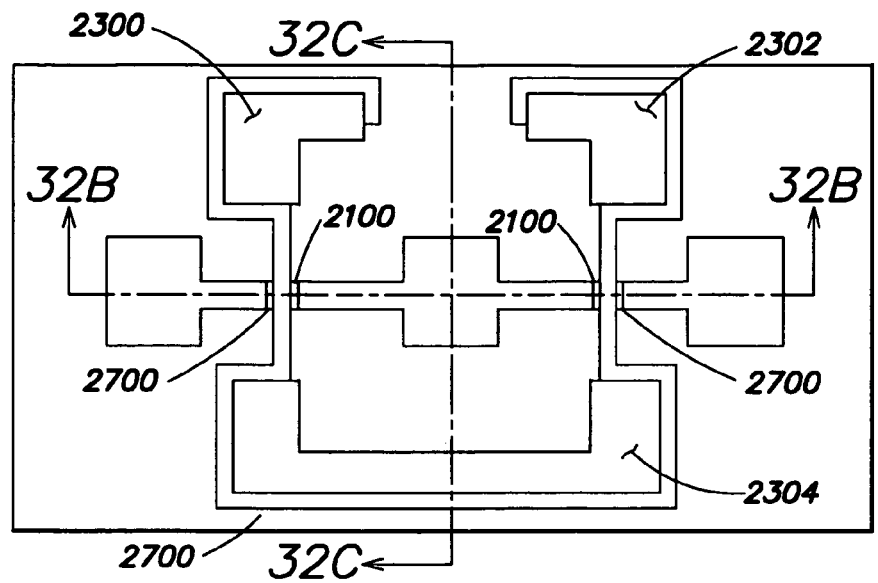
FIGS. 32A-C illustrate respective top, cross-sectional front and cross-sectional side views of a step of the second exemplary method of forming a FinFET in which portions of the gate dielectrics are etched from the substrate in accordance with an embodiment of the present invention.
Figure 32B:
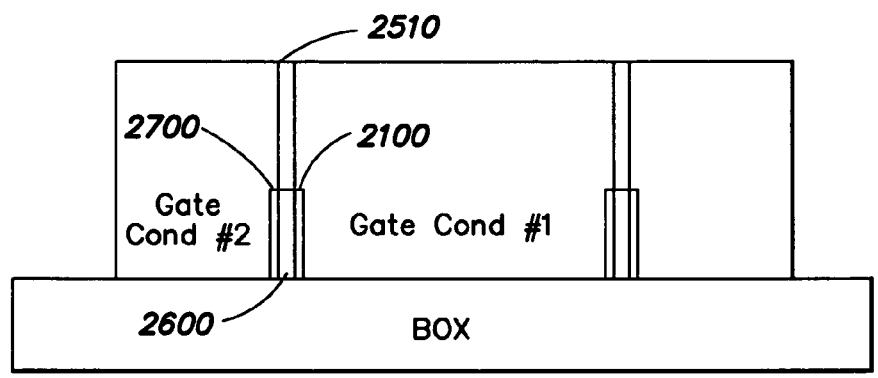
Figure 32C:
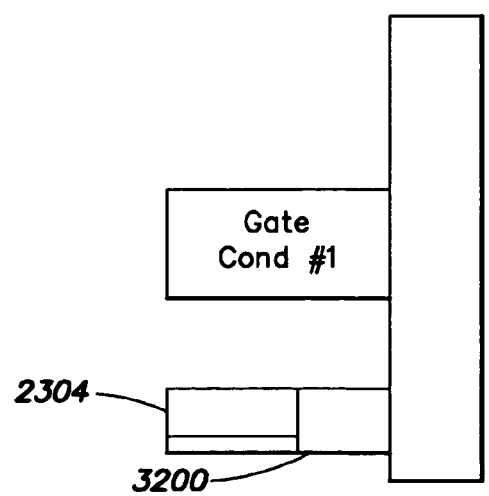

FIGS. 32A-C illustrate respective top, cross-sectional front and cross-sectional side views of a step of the second exemplary method of forming a FinFET in which portions of the gate dielectrics are etched from the substrate in accordance with an embodiment of the present invention. With reference to FIGS. 32A-C, exposed portions of the first and second dielectric layers 2100, 2700 may be removed (e.g., stripped). Therefore, sidewalls 3200 of silicon beneath the oxide regions 2300-2304 may be exposed. Gas phase doping, angled ion implantation or another suitable method for doping the silicon beneath the oxide regions 2300-2304, which may subsequently form a source or drain diffusion region in the FinFET, may be employed. In this manner, a source, drain or halo dopant may be introduced to the silicon beneath one or more of the oxide regions 2300-2304. Depending on the different types of semiconductor devices that are being manufactured, multiple masking steps may be employed during doping to provide desired doping effects to the different device types. During doping of the silicon beneath the oxide regions 2300-2304, the oxide spacer 2510 overlying the fin 2600, which may serve as conducting channel, may prevent the channel from becoming contaminated (e.g., by unwanted dopants).

Figure 33A:
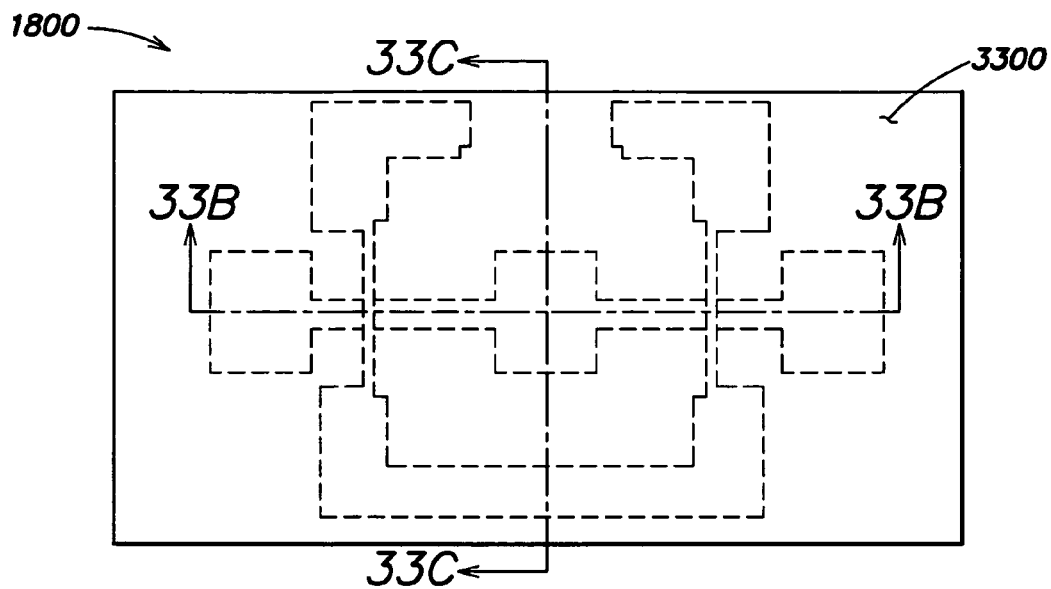
FIGS. 33A-C illustrate respective top, cross-sectional front and cross-sectional side views of a step of the second exemplary method of forming a FinFET in which an insulator is deposited on the substrate in accordance with an embodiment of the present invention.
Figure 33B:
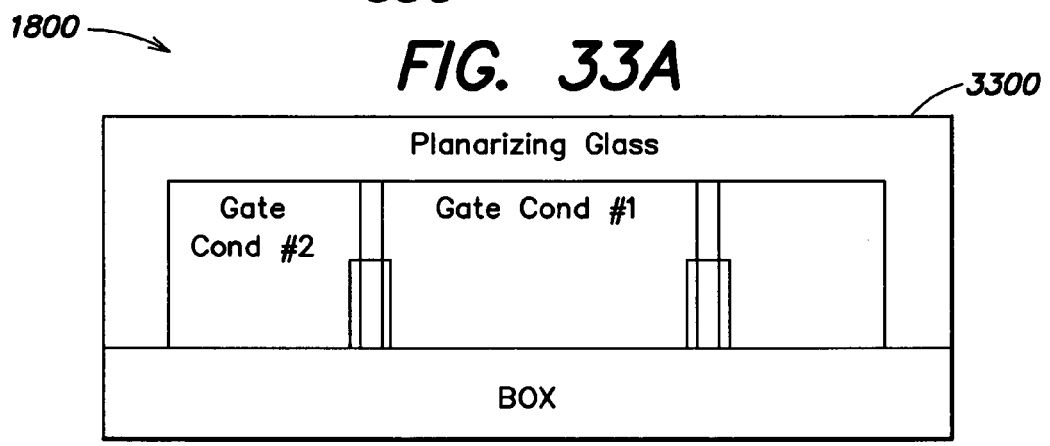
Figure 33C:
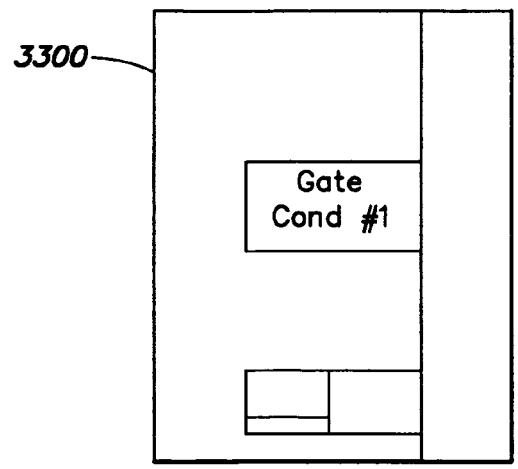

FIGS. 33A-C illustrate respective top, cross-sectional front and cross-sectional side views of a step of the second exemplary method of forming a FinFET in which an insulator is deposited on the substrate in accordance with an embodiment of the present invention. With reference to FIGS. 33A-C, CVD or another suitable method may be employed to deposit an insulator layer 3300, such as a planarizing glass (e.g., phosphosilicate glass (PSG), borosilicate glass (BSG), borophosphosilicate glass (BPSG), etc.) on a top surface of the substrate 1800. Thereafter, the insulator layer 3300 may be planarized. In some embodiments, the insulator may be reflowed to planarize insulator layer 3300. Alternatively, CMP or another suitable method may be employed to planarize the insulator layer 3300. Further, in contrast to the glass described above, in some embodiments, a spin on dielectric or the like may be employed.

Figure 34A:
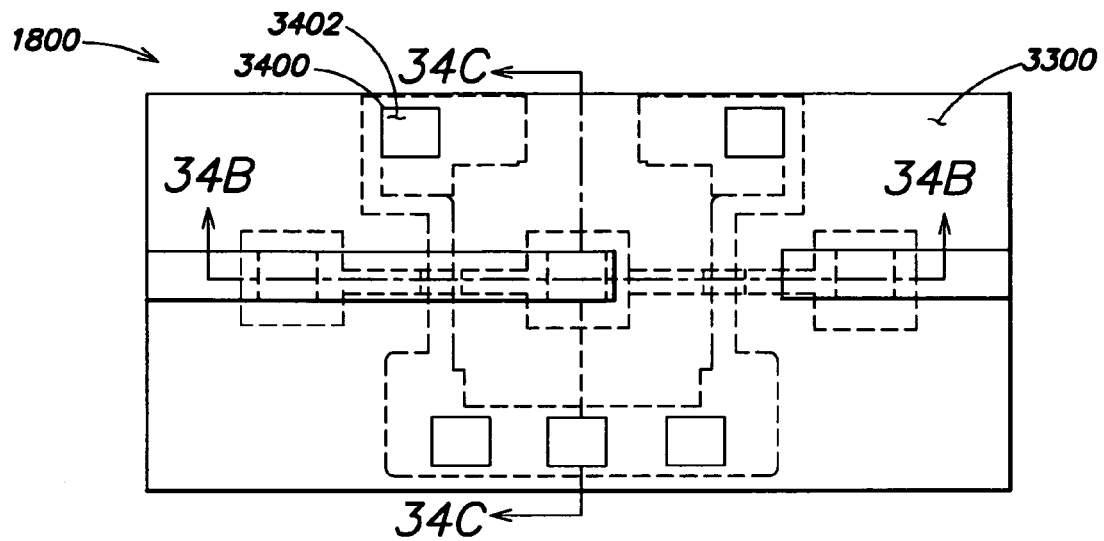
FIGS. 34A-C illustrate respective top, cross-sectional front and cross-sectional side views of a step of the second exemplary method of forming a FinFET in which wiring is formed on a transistor formed in the substrate in accordance with an embodiment of the present invention.
Figure 34B:
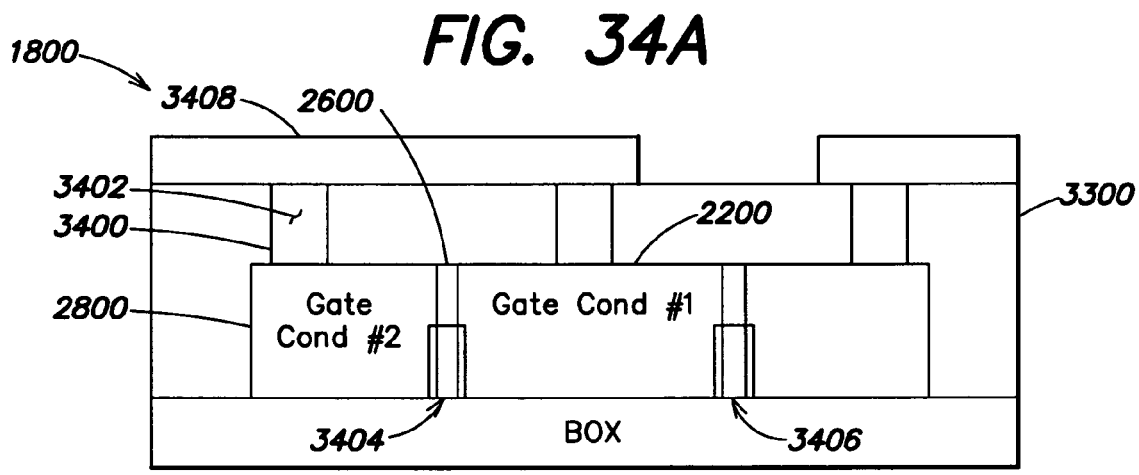
Figure 34C:
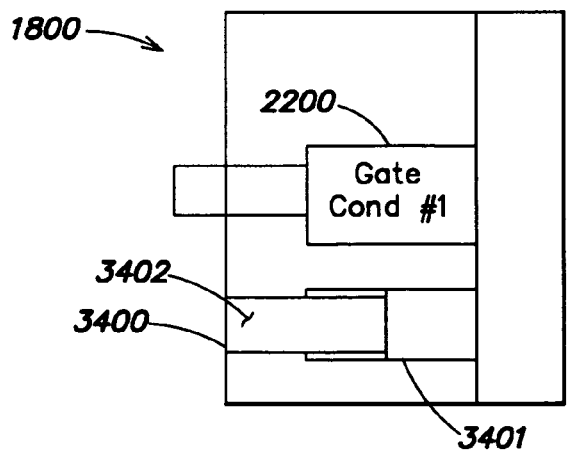

FIGS. 34A-C illustrate respective top, cross-sectional front and cross-sectional side views of a step of the second exemplary method of forming a FinFET in which wiring is formed on a transistor formed in the substrate in accordance with an embodiment of the present invention. With reference to FIGS. 34A-C, masked anisotropic etching such as RIE or another suitable method may be employed to etch one or more contact vias 3400 through the insulator layer 3300 (e.g., to the first gate conductor layer 2200, second gate conductor layer 2800, a diffusion region 3401 (e.g., silicon beneath an oxide region 2300-2304)). Thereafter, contacts 3402 may be formed. Further, metallurgy patterning or another suitable method may be employed to form wiring to one or more of a first gate conductor contact, second gate conductor contact, a source diffusion region contact and/or a drain diffusion region contact. As stated, the second exemplary method may form two FinFETs in the substrate 1800 (e.g., a first FinFET 3404 on the left side of the cross-sectional front view and a second FinFET 3406 on the right side of the cross-sectional front view). In some embodiments, a metal bridge 3408 may be formed between gate conductors 2200, 2800 formed on opposing sides of the fin 2600 of the first FinFET 3404. In this manner, the first FinFET 3404 may operate with the same voltage applied to opposing gates (e.g., a first gate coupled to the first gate conductor 2200 and a second gate coupled to the second gate conductor 2800) of the first FinFET 3404 (e.g., similar to operation of a conventional FinFET). In contrast, the wiring of the second FinFET 3406 may be such that opposing gates operate independently. In this manner the present methods and apparatus may provide a "split-gate" FinFET. However, the wiring for the first and/or second FinFET 3404, 3406 may be different. As described above, through use of the second exemplary method a FinFET in accordance with an embodiment of the present invention may be formed.

Through use of the first or second exemplary methods, support (e.g., on one or more sides) to silicon which ultimately forms a fin may be provided during (e.g., throughout) manufacturing. In this manner, damage to a fin while manufacturing a FinFET may be reduced and/or eliminated, and therefore, a semiconductor device manufacturing yield may be improved.

Further, in contrast to conventional methods, a structure of a FinFET resulting from the present methods is not limited. For example, a FinFET in accordance with the present methods and apparatus may include a first gate conductor of a first material, which has a first work function, coupled to a first gate of the FinFET, and a second gate conductor of a second, different material, which has a different work function, coupled to a second gate of the FinFET. Additionally or alternatively, a FinFET in accordance with the present methods and apparatus may include a first gate dielectric of a first material coupled to a first side of a fin of the FinFET and a second gate dielectric of a different (e.g., second) material coupled to a second side of the fin. Alternatively or additionally, a FinFET in accordance with the present methods and apparatus may include a first gate dielectric of a first width coupled to a first side of a fin of the FinFET and a second gate dielectric of a different (e.g., second) width coupled to a second side of the fin.

Figure 35:
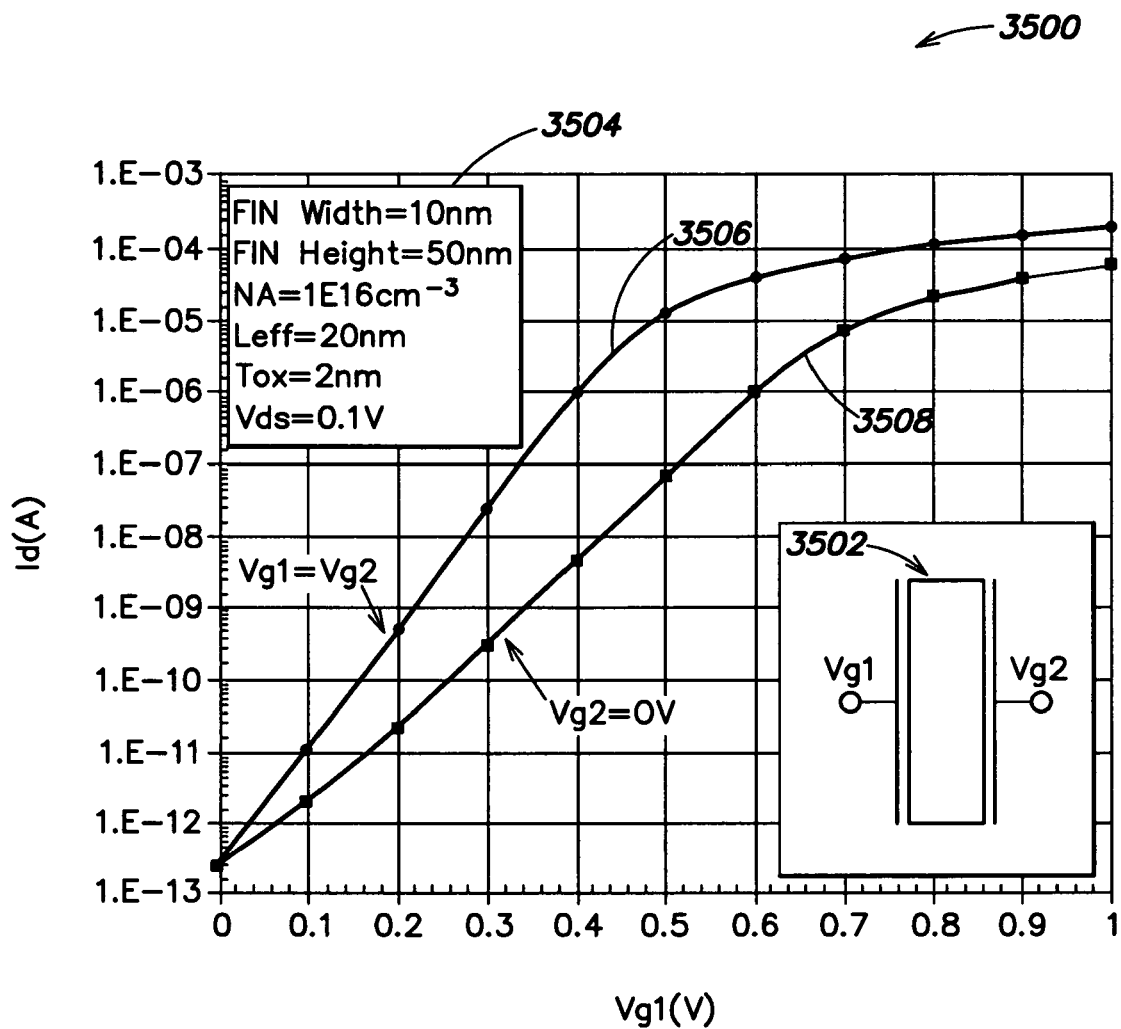
FIG. 35 illustrates a simulated relationship between drain current and voltages of first and second gates of a FinFET manufactured in accordance with an embodiment of the present invention.

FIG. 35 illustrates a simulated relationship 3500 between drain current and voltages of first and second gates of a FinFET 1704, 1706, 3404, 3406 manufactured in accordance with an embodiment of the present invention. With reference to FIG. 35, the FinFET 1704, 1706, 3404, 3406 (e.g., split-gate FinFET) may be useful for NOR gate logic. The simulation (e.g., Finite-Element Device Analysis (FIELDAY) simulation) is performed on a FinFET including a mid-gap work function gate conductor material, such as tungsten, $WSi_2$, $NSi_2$, etc. Further, the FinFET includes a 2 nm equivalent oxide thickness gate dielectric on both sidewalls of a fin in the FinFET. Additionally, uniform p-type doping of $1\times10^{16}$ $cm^{-3}$ is employed to create the fin. Therefore, bulk charge contributions to a threshold voltage ($V_t$) may be negligible. In the simulated relationship 3500 between electrical characteristics such as drain current (Id) and gate voltages (Vg1, Vg2) of the FinFET 1704, 1706, 3404, 3406, physical conditions and drain to source voltage (Vds) are shown in the legend 3504. For a first curve 3506, Vg1 (e.g., a left gate voltage) and Vg2 (e.g., a right gate voltage) are ramped from 0 to 1.0 V simultaneously (e.g., opposing gates of the FinFET are tied together). In contrast, for a second curve 3508, Vg2 is held constant at 0 V, while Vg1 is ramped from 0 to 1.0 V. The two distinct operating modes illustrated by the first and second curves 3506-3508, respectively, form the basis of compact logic structures using split-gate FinFETs in accordance with an embodiment of the present invention. Although threshold voltages may appear high for logic applications including gate conductors having a work gate function (e.g., mid-bandgap) of the present simulation, a lower and/or an optimized Vt may be obtained by employing gate conductor work function engineering to yield a desired work function (e.g., a more n-type gate conductor work function).

Figure 36:
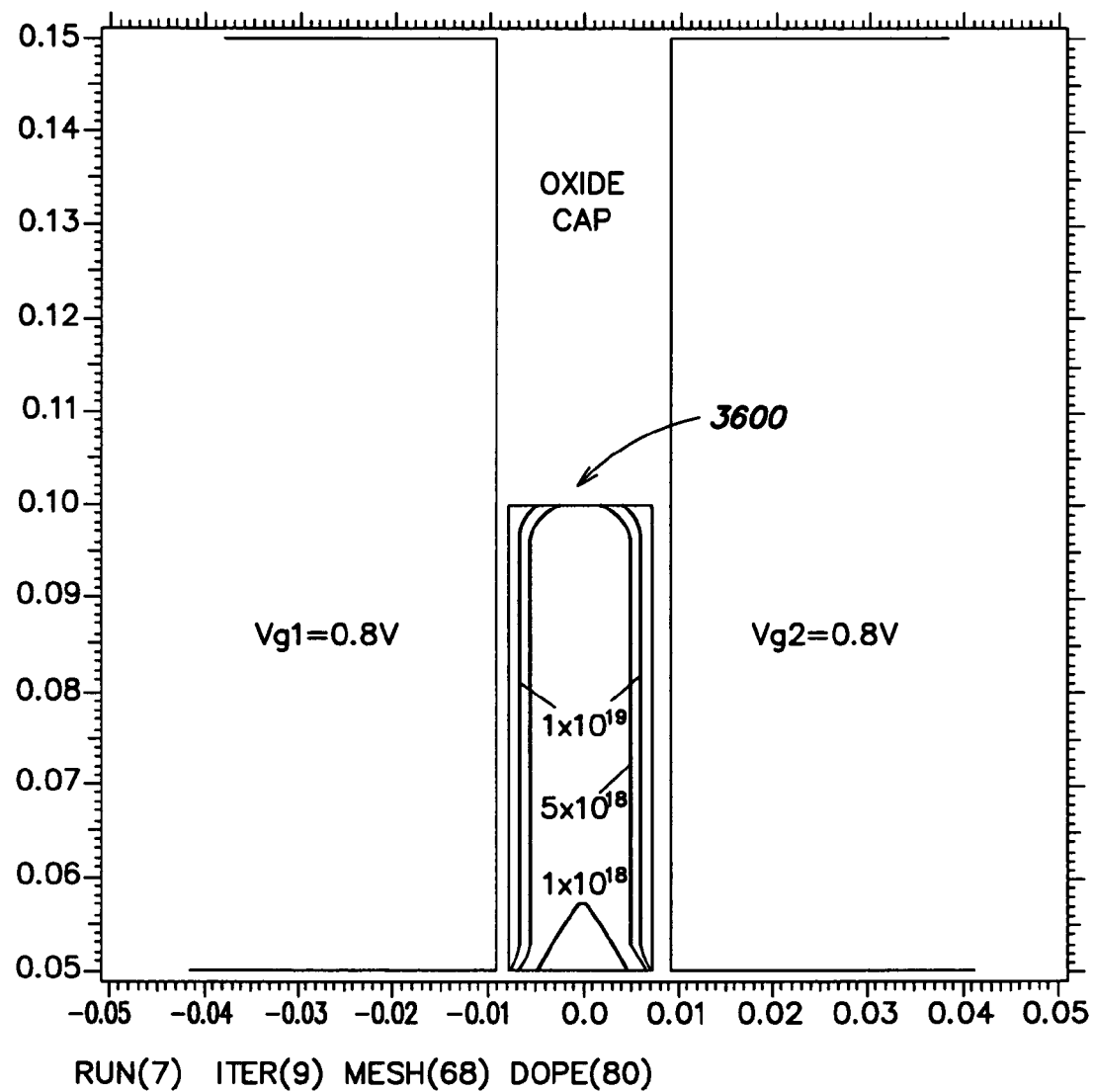
FIG. 36 illustrates first exemplary contours of constant electron concentration in a plane cut through the channel of a FinFET manufactured in accordance with an embodiment of the present invention.

FIG. 36 illustrates first exemplary contours 3600 of constant electron concentration in a plane cut through the channel of a FinFET manufactured in accordance with an embodiment of the present invention. More specifically, with reference to FIG. 36, the plane may cut through a channel normal to a direction of a source-drain current of an n-channel FinFET in accordance with an embodiment of the present invention. The first exemplary contours 3600 indicate electron concentration is substantial throughout a fin of the FinFET, which corresponds to volume inversion. Such contours 3600 may result when voltages (Vg1 and Vg2) applied to opposing gates of the FinFET, respectively, are biased at 0.8 V. It should be noted that in some embodiments electron concentration through the fin may vary by less than one order of magnitude.

Figure 37:
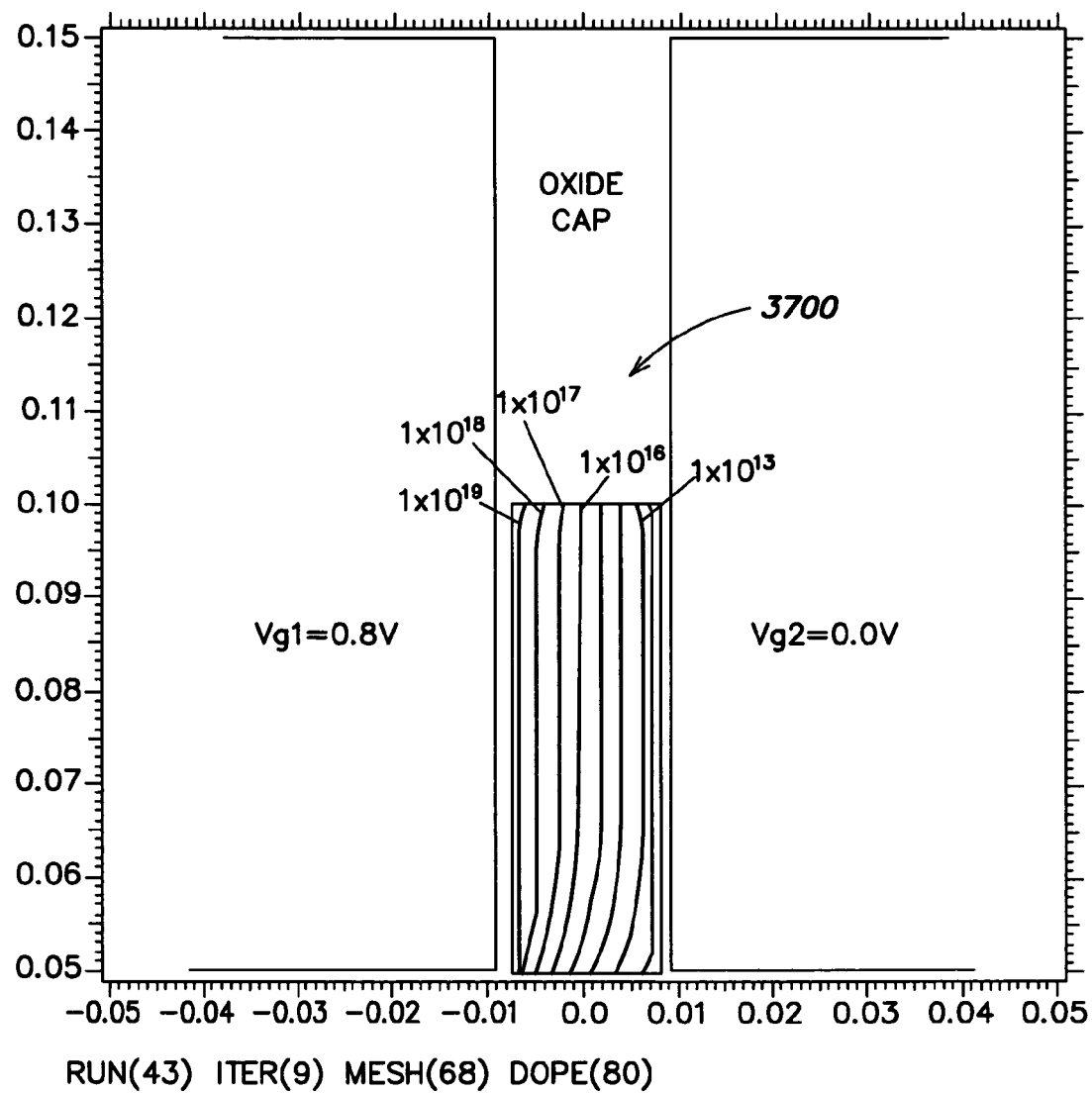
FIG. 37 illustrates second exemplary contours of constant electron concentration in the plane cut through the channel of the FinFET of FIG. 36 in accordance with an embodiment of the present invention.

FIG. 37 illustrates second exemplary contours of constant electron concentration in the plane cut through the channel of the FinFET of FIG. 36 in accordance with an embodiment of the present invention. With reference to FIG. 37, the second exemplary contours 3700 indicate channel electrons are mainly confined to a left sidewall of the fin, which corresponds to surface inversion. Such contours may result when a first gate (e.g., a left gate) of the FinFET is biased at 0.8 V while a second gate (e.g., a right gate) of the FinFET is held at 0 V. It should be noted that in some embodiments electron concentration through the fin varies by over six orders of magnitude, which may result in a much larger sub-Vt swing.

Figure 38:
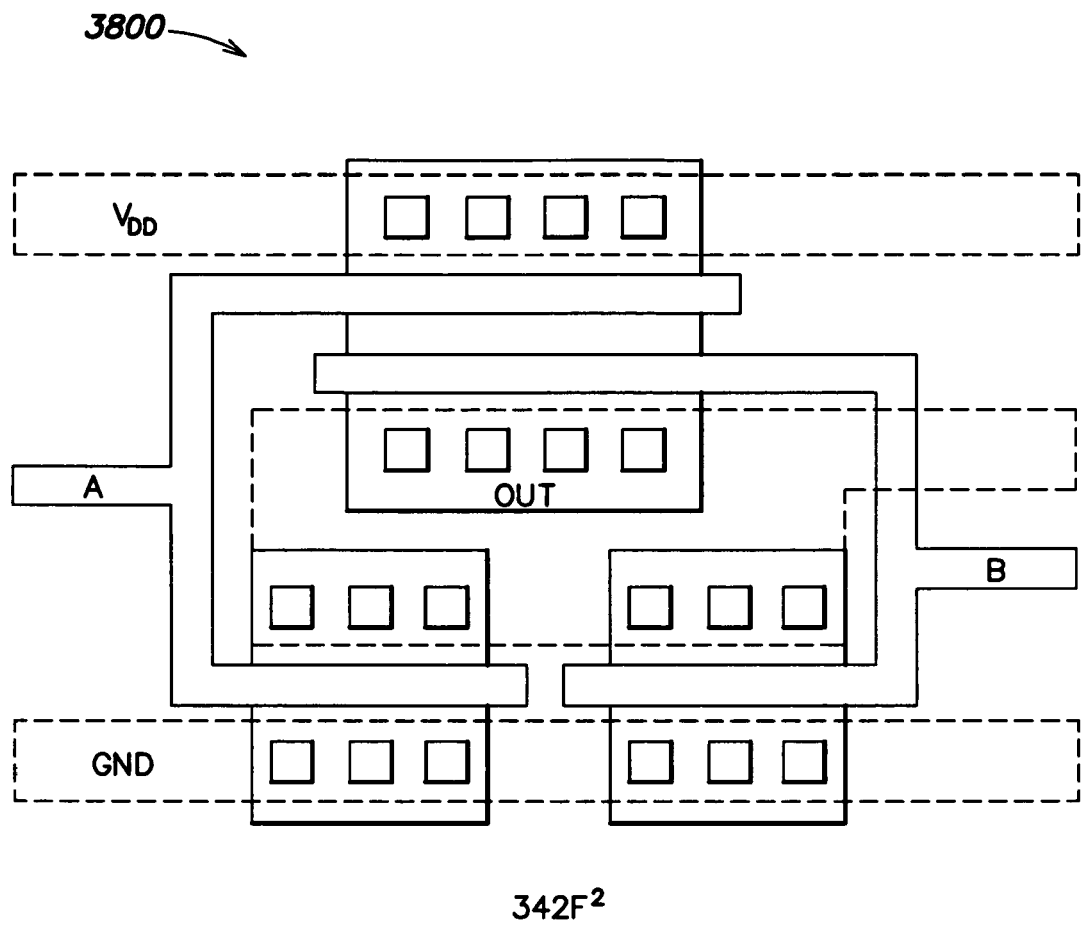
FIG. 38 illustrates a layout of conventional MOSFETs on a substrate to form NOR logic.

FIG. 38 illustrates a layout 3800 of conventional MOSFETs on a substrate to form NOR logic. With reference to FIG. 38, a layout 3800 of a two-input NOR gate using conventional SOI CMOS transistors is shown. The layout 3800 requires 342 $F^2$ of substrate area, where F represents a minimum lithographic feature size.

Figure 39:
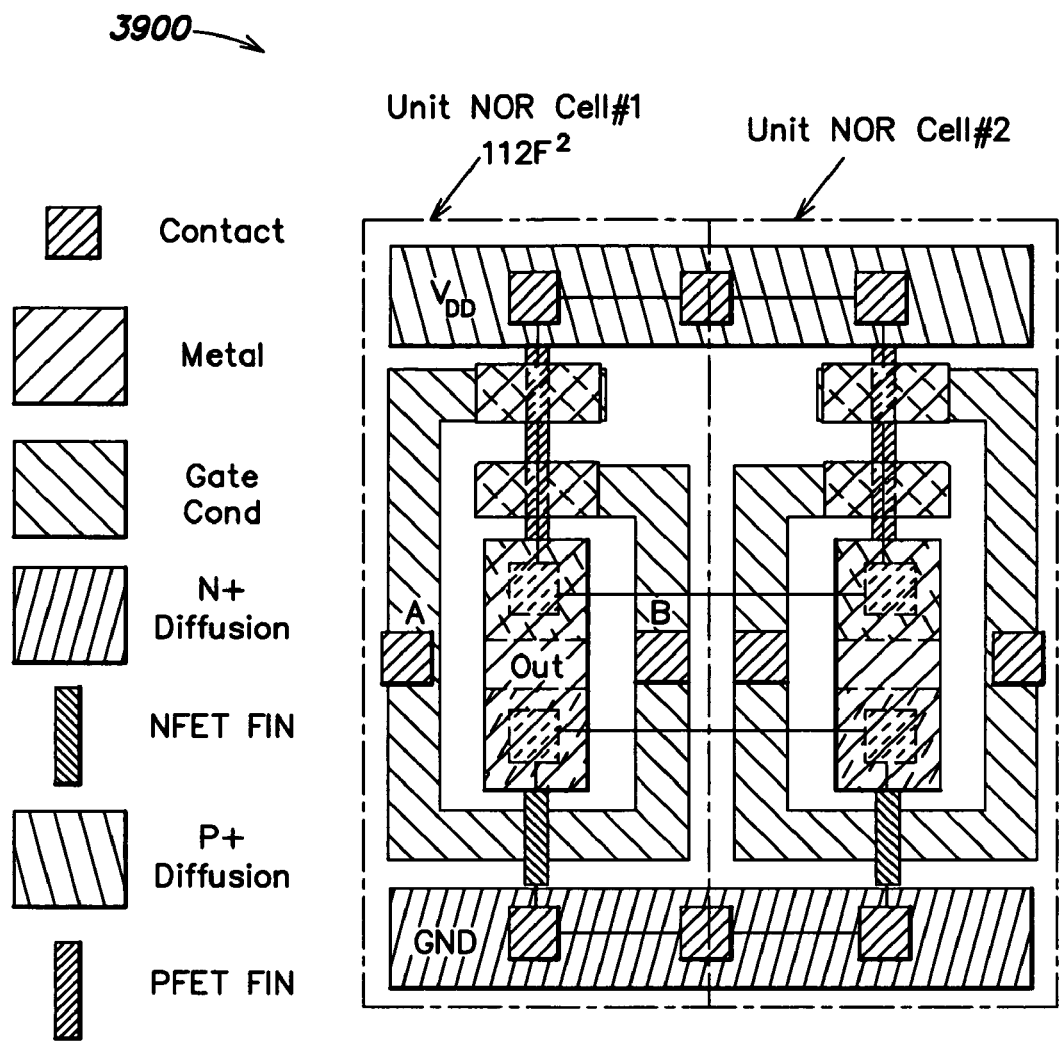
FIG. 39 illustrates a layout of FinFETs on a substrate to form NOR logic in accordance with an embodiment of the present invention.

In contrast, FIG. 39 illustrates a layout 3900 of FinFETs on a substrate to form NOR logic in accordance with an embodiment of the present invention. With reference to FIG. 39, a layout of a two-input NOR gate using split-gate FinFETs 1704, 1706, 3404, 3406 is shown. In contrast to the layout 3800 of conventional MOSFETs, the layout 3900 of FinFETs requires 112 $F^2$ of substrate area. Therefore, the FinFETs in accordance with an embodiment of the present invention may use chip real estate more efficiently than conventional transistors.

The foregoing description discloses only exemplary embodiments of the invention. Modifications of the above disclosed apparatus and methods which fall within the scope of the invention will be readily apparent to those of ordinary skill in the art. For instance, the present methods and apparatus may provide advantages such as (1) allowing independent work functions for opposing gates of a FinFET by using different opposing gate conductor materials (e.g., polysilicon and metal on respective opposing sides, polysilicon and silicide on respective opposing sides, metal and silicide on respective opposing sides, etc); (2) allowing for independent gate dielectric materials and/or thicknesses on opposing sides of a FinFET fin; (3) allowing selective bridging of opposing gates of a FinFET, if tied gate operation is desired; (4) allowing for a gate-bridging conductor which is borderless (e.g., does not directly contact the gate conductors) to the cross the fin and couple opposing gates of a FinFET; (5) providing a robust process which protects the structural integrity of a FinFET fin, which may be narrow and/or have a high aspect ratio, through all process steps, thereby minimizing process-induced damage; (6) employing "split-gate" transistors in a NOR circuit to reduce required chip real estate; and/or (7) reducing and/or eliminating diffusion underlap problems toward a bottom of a FinFET fin. Further, the present methods and apparatus may enable gate doping on opposing sides of a fin to remain separated. Additionally, the present methods and apparatus may be integrated with conventional planar CMOS technology.

It should be noted the present invention also provides advantages conventionally provided by FinFET technology over planar CMOS technology, such as (1) a near ideal sub-Vt slope; (2) greatly reduced short-channel effects; (3) a greatly reduced floating-body parasitic bipolar effect due to inherent fully-depleted operation; (4) improved Vt matching due to negligible ionized impurity bulk charge; (5) a high current drive due to volume inversion and height of fin; and/or (6) a relaxed need for gate dielectric scaling. Such advantages are known to one of skill in the art, and therefore, are not described in detail herein.

Accordingly, while the present invention has been disclosed in connection with exemplary embodiments thereof, it should be understood that other embodiments may fall within the spirit and scope of the invention, as defined by the following claims.

The invention claimed is:

1. A semiconductor device, comprising:
    a fin, having a first side and a second side, adapted to define a channel of the semiconductor device;
    a first gate conductor of a first material composite coupled to the first side of the fin; and
    a second gate conductor of a second material composite coupled to the second side of the fin,
    wherein the first and second gate conductors are adapted to control a current through the channel, and wherein the second composite differs from the first composite.

2. The semiconductor device of claim 1 wherein the first gate conductor is separated from the second gate conductor via an oxide spacer.

3. The semiconductor device of claim 1 further comprising:
    a first dielectric of a first material coupled to the first side of the fin; and
    a second dielectric of a second material coupled to the second side of the fin.

4. The semiconductor device of claim 3 wherein:
    the first dielectric is of a first width; and
    the second dielectric is of a second width.

5. The semiconductor device of claim 1 further comprising wiring coupling the first gate connector to the second gate connector.

* * * * *